(12) United States Patent
Arita et al.

(10) Patent No.: US 7,871,901 B2
(45) Date of Patent: Jan. 18, 2011

(54) MANUFACTURING METHOD FOR SEMICONDUCTOR CHIPS

(75) Inventors: Kiyoshi Arita, Fukuoka (JP); Akira Nakagawa, Saga (JP)

(73) Assignee: Panasonic Corporation, Osaka (JP)

( * ) Notice: Subject to any disclaimer, the term of this patent is extended or adjusted under 35 U.S.C. 154(b) by 491 days.

(21) Appl. No.: 11/911,918

(22) PCT Filed: Apr. 17, 2006

(86) PCT No.: PCT/JP2006/308479

§ 371 (c)(1),
(2), (4) Date: Oct. 18, 2007

(87) PCT Pub. No.: WO2006/112524

PCT Pub. Date: Oct. 26, 2006

(65) Prior Publication Data

US 2009/0093104 A1    Apr. 9, 2009

(30) Foreign Application Priority Data

Apr. 19, 2005  (JP)  ............................. 2005-120815

(51) Int. Cl.
*H01L 21/00*    (2006.01)
(52) U.S. Cl. ............................ 438/462; 438/33; 438/68;
438/113; 438/114; 438/458; 438/464; 438/463;
438/461; 438/460; 438/465; 257/E21.214
(58) Field of Classification Search .................. 438/33,
438/68, 113, 114, 458, 460, 461, 462, 463,
438/464, 465; 257/E21.214
See application file for complete search history.

(56) References Cited

U.S. PATENT DOCUMENTS 5,324,981  A    6/1994  Kobiki et al.
(Continued)

FOREIGN PATENT DOCUMENTS

JP    2004-172365    6/2004

OTHER PUBLICATIONS

Patent Cooperation Treaty (PCT) International Preliminary Report on Patentability, issued Oct. 23, 2007.
International Search Report issued Jul. 7, 2006 in the International (PCT) Application of which the present application is the U.S. National Stage.

(Continued)

*Primary Examiner*—Davienne Monbleau
*Assistant Examiner*—Hajar Kolahdouzan
(74) *Attorney, Agent, or Firm*—Wenderoth, Lind & Ponack, L.L.P.

(57) ABSTRACT

A method of manufacturing semiconductor chips including forming dividing-groove portions in accordance with dividing regions on the second surface of a semiconductor wafer where an insulating film is placed in the dividing regions of the first surface and performing etching of the entire second surface and the surfaces of the dividing-groove portions by performing plasma etching from the second surface. Thereby corner portions on the second surface side are removed, while the insulating film is exposed from the etching bottom portion by removing the dividing-groove portions in the dividing regions. Also, by continuously performing the plasma etching in a state in which the exposed insulating film is surface charged with electric charge due to ions in plasma, corner portions on in contact with the insulating film on the first surface side are removed, and semiconductor chips that have a high transverse rupture strength are provided.

19 Claims, 30 Drawing Sheets

U.S. PATENT DOCUMENTS

| | | | |
|---|---|---|---|
| 6,935,724 B2* | 8/2005 | Silverbrook | ................. 347/54 |
| 2001/0001215 A1 | 5/2001 | Siniaguine et al. | |
| 2004/0102025 A1 | 5/2004 | Arita | |
| 2005/0072766 A1* | 4/2005 | Arita | .................... 219/121.44 |

OTHER PUBLICATIONS

PCT Written Opinion of the International Searching Authority (in English language), issued in International Application No. PCT/JP2006/308479.

* cited by examiner

Fig. 15

| PLASMA PROCESSING CONDITIONS | GAS COMPOSITION | | | PRESSURE (Pa) | FREQUENCY (MHz) |
|---|---|---|---|---|---|
| | SF6 | O2 | CHF3 | | |
| PLASMA PROCESSING CONDITIONS FOR ANISOTROPIC ETCHING 81A | 10 | 2 | — | 100 | 60 |
| PLASMA PROCESSING CONDITIONS FOR SILICON OXIDE REMOVAL 81B | — | — | 20 | 50 | 13.56 |

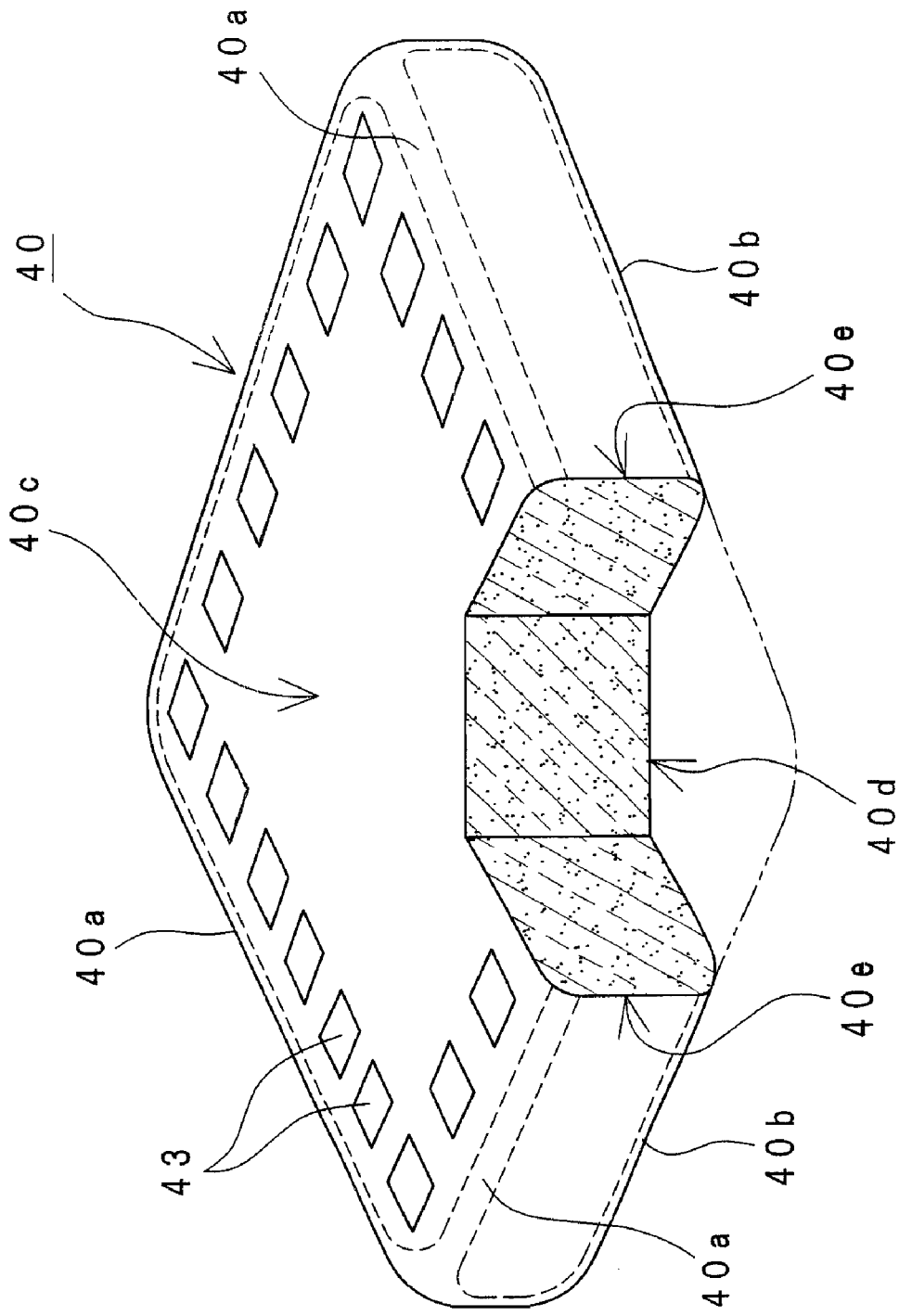

MANUFACTURING METHOD FOR SEMICONDUCTOR CHIPS

BACKGROUND OF THE INVENTION

1. Technical Field

The present invention relates to a manufacturing method for semiconductor chips for forming semiconductor devices arranged in a plurality of device-formation-regions defined by dividing regions on a first surface of a semiconductor wafer and individually separating the device-formation-regions of the semiconductor wafer along the dividing regions, thereby manufacturing semiconductor chips that include the individualized semiconductor devices and to a semiconductor chip.

2. Description of the Related Art

Conventionally, as a method for dividing a semiconductor wafer into individual semiconductor chips by such a manufacturing method for semiconductor chips, various methods have been known. For example, a method for dividing a semiconductor wafer by mechanically cutting the wafer by means of a rotary blade called the dicer blade, i.e., mechanical dicing is known.

However, semiconductor wafers have recently been made thinner and thinner, and a semiconductor wafer susceptible to external forces is subjected to the mechanical dicing described above, it is often the case where the semiconductor wafer is damaged at the time of cutting. This leads to a problem that a reduction in the processing yield cannot be avoided. As such damage, there is, for example, the occurrence of chipping that the corner portions (edges) of the semiconductor chips become chipped due to the sharply cut shape.

In recent years, plasma dicing that uses plasma etching has been attracting attention in place of the conventional mechanical dicing described above (reference should be made to, for example, Japanese unexamined patent publication No. 2004-172365 A). A method for dividing a semiconductor wafer into individual semiconductor chips by the conventional plasma dicing is described herein with reference to the schematic explanatory views shown in FIGS. 28A through 28C and FIGS. 29A and 29B.

First of all, as shown in FIG. 28A, a semiconductor wafer 501 is put into a state in which semiconductor devices 502 are formed in the respective device-formation-regions R1 defined by dividing regions R2 on its circuit-formation-face 501a. Each of the semiconductor devices 502 includes devices such as a MOS (Metal-Oxide-Semiconductor) structure transistor constructed of a semiconductor wafer 501 (Semiconductor), a silicon oxide 551 (Oxide) formed directly on the circuit-formation-face 501a and a metal film (Metal) formed on the silicon oxide 551. Further, the semiconductor device 502 further includes connection terminals 552 (also called the bonding pads) for electrically connecting the devices to external electronic apparatuses. Moreover, a surface protection film 553 is formed on the surfaces of the semiconductor devices 502, so that the surfaces of the semiconductor devices 502 are protected. The connection terminals 552 are exposed outside without being covered with the surface protection film 553. Neither the silicon oxide 551 nor the surface protection film 553 is formed in portions that correspond to the dividing regions R2 of the circuit-formation-face 501a.

Next, as shown in FIG. 28B, a protective sheet 504 is peelably adhesively stuck to the circuit-formation-face 501a via an adhesive so that the circuit-formation-face 501a of the semiconductor wafer 501 does not suffer damages. Subsequently, a mask (mask pattern) 505 is placed on a surface 501b to be processed, or the surface opposite from the circuit-formation-face 501a so that the portions that correspond to the dividing regions R2 are exposed.

Next, by performing plasma etching on the semiconductor wafer 501 on which the mask 505 is thus formed, the exposed surface of the surface 501b that is not covered with the mask 505 is etched, removing the portions that correspond to the dividing regions R2. Through this process, as shown in FIG. 28C, the device-formation-regions R1 are individually separated, forming the individual pieces of the semiconductor chips 510 that include the semiconductor devices 502. Consequently, the semiconductor wafer 501 is divided into the individual pieces of the semiconductor chips 510 that include the respective semiconductor devices 502 along the dividing regions R2.

Subsequently, as shown in FIG. 29A, the mask 505 that is remaining on the surface 501b to be processed of the separated semiconductor chips 510 is removed by carrying out, for example, an ashing process. Subsequently, as shown in FIG. 29B, an adhesive sheet (dicing sheet) 506 is stuck to the surface 501b to be processed of the semiconductor wafer 501, and the protective sheet 504 that has protected the circuit-formation-face 501a of the semiconductor wafer 501 is peeled off. As a result, the semiconductor chips 510 are arranged on the adhesive sheet 506 in a state in which they are separated into individual pieces.

By dividing the semiconductor wafer 501 using the conventional plasma dicing described above, damages given to the manufactured semiconductor chips 510 can be reduced in comparison with the aforementioned mechanical dicing.

SUMMARY OF THE INVENTION

However, even the semiconductor chips 510, which are divided into the individual pieces by the conventional plasma dicing described above, are to have sharp corner portions 554 (edges) formed by the separation as shown in FIGS. 28C, 29A and 29B. There is a problem that the occurrence of chipping cannot be avoided when the sharp corner portions 554 are formed on the semiconductor chips 510 as described above.

In particular, the conventional plasma dicing described above has a characteristic that the ions in the plasma have increasing difficulties in reaching the etching bottom portion as getting closer to the bottom portion. Therefore, it is sometimes the case where the protrusive sharp corner portions 554 are formed at the lower end portions of the separated semiconductor chips 510 as shown in, for example, the partially enlarged schematic view of the etched dividing region R2 shown in FIG. 30. In such a case, there is a problem that the corner portions 554 become more easily chipped and the transverse rupture strength of the semiconductor chip is reduced.

Further, in the semiconductor chips 510, as shown in FIG. 30, not only the formation of the sharp corner portions 554 on the circuit-formation-face 501a but also the formation of sharp corner portions 555 on the surface 50b to be processed result, and this leads to a problem that the reduction in the transverse rupture strength of the semiconductor chips 510 becomes more noticeable.

Moreover, the mask used in the conventional plasma dicing as described above is generally formed by an optical method using photolithograph, and the mask formation by the photolithograph has the problem that the cost of the whole plasma dicing processing is increased by the addition of a complicated processing of high processing cost, and the processing cannot efficiently be achieved.

An object of the present invention is to solve the aforementioned problems and provide a semiconductor chip manufacturing method for forming individualized semiconductor chips by dividing a semiconductor wafer, capable of providing a high transverse rupture strength without damaging the semiconductor chips while reducing the cost and increasing the efficiency of the manufacturing processes.

In order to achieve the object, the present invention is constituted as follows.

According to a first aspect of the present invention, there is provided a manufacturing method for semiconductor chips comprising:

forming dividing-groove portions in dividing regions on a second surface of a semiconductor wafer that has a first surface on which semiconductor devices placed in a plurality of device-formation-regions defined by dividing regions and an insulating film placed in the dividing regions are placed and the second surface located opposite from the first surface;

performing plasma etching to the semiconductor wafer from the second surface thereof to etch entire surface of the second surface and surfaces of the dividing-groove portions, whereby corner portions located on the second surface side are removed in the device-formation-regions, and the insulating film is exposed from an etching bottom portion by removing the dividing-groove portions in the dividing regions;

removing corner portions on the first surface side put in contact with the insulating film in the device-formation-regions by continuously performing the plasma etching in a state in which exposed surface of the insulating film is charged with electric charge due to ions in plasma; and subsequently, removing the exposed insulating film from the second surface so that the device-formation-regions are individually separated, whereby semiconductor chips each of which includes the individualized semiconductor device are manufactured.

According to a second aspect of the present invention, there is provided the manufacturing method for the semiconductor chips as defined in the first aspect, wherein, in forming the dividing-groove portions, the dividing-groove portions are formed so that their depth dimension becomes equal to or greater than a thickness dimension of the semiconductor devices that are finally separated into individual pieces.

According to a third aspect of the present invention, there is provided the manufacturing method for the semiconductor chips as defined in the first aspect, wherein a damaged layer generated in the neighborhood of the dividing-groove portions due to the formation of the dividing-groove portions is removed by performing the plasma etching.

According to a fourth aspect of the present invention, there is provided the manufacturing method for the semiconductor chips as defined in the first aspect, wherein the semiconductor wafer is reduced in thickness by carrying out an abrading process on the second surface of the semiconductor wafer before the formation of the dividing-groove portions, and the damaged layer generated in the neighborhood of the second surface due to the abrading process is removed by the plasma etching after the formation of the dividing-groove portions.

According to a fifth aspect of the present invention, there is provided the manufacturing method for the semiconductor chips as defined in the first aspect, wherein, in forming the dividing-groove portions, the dividing-groove portions are formed by processing the second surface of the semiconductor wafer by means of a dicer.

According to a sixth aspect of the present invention, there is provided the manufacturing method for the semiconductor chips as defined in the first, wherein, in the plasma etching from the second surface, the insulating film formed of silicon oxide ($SiO_2$) on the first surface of the semiconductor wafer is exposed from the etching bottom portion.

According to a seventh aspect of the present invention, there is provided the manufacturing method for the semiconductor chips as defined in the first aspect, wherein, in the plasma etching from the second surface, a surface protection film formed of polyimide (PI) to protect surfaces of the semiconductor devices formed on the first surface of the semiconductor wafer is exposed from the etching bottom portion as the insulating film.

According to an eighth aspect of the present invention, there is provided a manufacturing method for semiconductor chips comprising:

forming dividing-groove portions in dividing regions on a second surface of a semiconductor wafer that has a first surface on which semiconductor devices placed in a plurality of device-formation-regions defined by dividing regions and an insulating film placed in the dividing regions are placed and the second surface located opposite from the first surface;

performing plasma etching to the semiconductor wafer from the second surface thereof to etch entire surface of the second surface and surfaces of the dividing-groove portions, whereby corner portions located on the second surface side are removed in the device-formation-regions, and the insulating film is exposed from an etching bottom portion by removing the dividing-groove portions in the dividing regions; and removing the exposed insulating film while removing corner portions on the first surface side put in contact with the insulating film in the device-formation-regions by continuously performing the plasma etching in a state in which exposed surface of the insulating film is charged with electric charge due to ions in plasma, whereby the device-formation-regions are individually separated and consequently semiconductor chips each of which includes the individualized semiconductor device are formed.

According to a ninth aspect of the present invention, there is provided the manufacturing method for the semiconductor chips as defined in the eighth aspect, wherein, in forming the dividing-groove portions, the dividing-groove portions are formed so that their depth dimension becomes equal to or greater than a thickness dimension of the semiconductor devices that are finally separated into individual pieces.

According to a tenth aspect of the present invention, there is provided the manufacturing method for the semiconductor chips as defined in the eighth aspect, wherein a damaged layer generated in the neighborhood of the dividing-groove portions due to the formation of the dividing-groove portions is removed by performing the plasma etching.

According to an eleventh aspect of the present invention, there is provided the manufacturing method for the semiconductor chips as defined in the eighth aspect, wherein the semiconductor wafer is reduced in thickness by carrying out an abrading process on the second surface of the semiconductor wafer before the formation of the dividing-groove portions, and the damaged layer generated in the neighborhood of the second surface due to the abrading process is removed by the plasma etching after the formation of the dividing-groove portions.

According to a twelfth aspect of the present invention, there is provided the manufacturing method for the semiconductor chips as defined in the eighth aspect, wherein, in forming the dividing-groove portions, the dividing-groove portions are formed by processing the second surface of the semiconductor wafer by means of a dicer.

According to a thirteenth aspect of the present invention, there is provided the manufacturing method for the semiconductor chips as defined in the eighth aspect, wherein, in the plasma etching from the second surface, a surface protection film that is formed of silicon nitride ($Si_3N_4$) to protect the surfaces of the semiconductor devices formed on the first surface of the semiconductor wafer is exposed from the etching bottom portion as the insulating film.

According to a fourteenth aspect of the present invention, there is provided a manufacturing method for semiconductor chips comprising:

forming dividing-groove portions in dividing regions on a second surface of a semiconductor wafer that has a first surface on which semiconductor devices are placed in a plurality of device-formation-regions defined by dividing regions and the second surface located opposite from the first surface;

performing plasma etching from the second surface to the semiconductor wafer, where a protective sheet that has an insulating property is stuck to the first surface, to etch entire surface of the second surface and surfaces of dividing-groove portions, whereby corner portions located on the second surface side are removed in the device-formation-regions, and the insulating protective sheet is exposed from an etching bottom portion by removing the dividing-groove portions in the dividing regions, and then the device-formation-regions are separated into individual semiconductor chips; and removing corner portions on the first surface side put in contact with the insulating protective sheet on the semiconductor chips by continuously performing the plasma etching in a state in which exposed surface of the insulating protective sheet is charged with electric charge due to ions in plasma, whereby semiconductor chips each of which includes the individualized semiconductor device are manufactured.

According to a fifteenth aspect of the present invention, there is provided the manufacturing method for the semiconductor chips as defined in the fourteenth aspect, wherein, in forming the dividing-groove portions, the dividing-groove portions are formed so that their depth dimension becomes equal to or greater than a thickness dimension of the semiconductor devices that are finally separated into individual pieces.

According to a sixteenth aspect of the present invention, there is provided the manufacturing method for the semiconductor chips as defined in the fourteenth aspect, wherein a damaged layer generated in the neighborhood of the dividing-groove portions due to the formation of the dividing-groove portions is removed by performing the plasma etching.

According to a seventeenth aspect of the present invention, there is provided the manufacturing method for the semiconductor chips as defined in the fourteenth aspect, wherein the semiconductor wafer is reduced in thickness by carrying out an abrading process on the second surface of the semiconductor wafer before the formation of the dividing-groove portions, and the damaged layer generated in the neighborhood of the second surface due to the abrading process is removed by the plasma etching after the formation of the dividing-groove portions.

According to an eighteenth aspect of the present invention, there is provided the manufacturing method for the semiconductor chips as defined in the fourteenth aspect, wherein, in forming the dividing-groove portions, the dividing-groove portions are formed by processing the second surface of the semiconductor wafer by means of a dicer.

According to a nineteenth aspect of the present invention, there is provided the manufacturing method for the semiconductor chips as defined in the fourteenth aspect, wherein, the corner portions on the second surface side are removed, and thereafter, the insulating protective sheet is peeled off and removed from the first surface of the semiconductor wafer.

Moreover, according to another aspect of the present invention, it is possible to provide a semiconductor chip that has a roughly rectangular shape obtained by dividing a semiconductor wafer in which a plurality of semiconductor devices are formed into individual pieces of the semiconductor devices, wherein the rectangular shape of the chip is defined by rounded ridgelines thereof.

Moreover, a curved convex surface portion can be formed in each of the portions that correspond to the ridgelines of the rectangular shape.

Moreover, it is possible to provide a semiconductor chip including:

a first surface on which a semiconductor device is formed;

a second surface that is parallel to the first surface and located on the side opposite from the first surface; and a connection surface that is located at the peripheries of the first surface and the second surface and connects an outer end portion of the first surface with an outer end portion of the second surface, wherein the connection surface has a curved convex surface portion so that no ridgeline is formed at the end portions of the first surface and the second surface.

Moreover, it is also possible that the connection surface is comprised of the curved convex surface portion.

According to the present invention, by employing the semiconductor wafer on which the insulating film is placed in the portions that correspond to the dividing regions of the first surface as the semiconductor wafer, forming dividing-groove portions in accordance with the dividing regions of the second surface and thereafter removing the corner portions of the formed semiconductor chips by performing a plasma etching process on the surface, a semiconductor chip manufacturing method capable of forming, for example, R-portions (rounded portions or curved convex surface portions) at the removed corner portions and improving the transverse rupture strength can be provided.

By carrying out the plasma etching process on the semiconductor wafer on the entire second surface and the surface of the dividing-groove portions by performing plasma etching on the semiconductor wafer where the dividing-groove portions are formed in accordance with the dividing regions of the second surface, the corner portions and the ridgelines located on the second surface side of the device-formation-regions can be removed. Concurrently with it, by exposing the insulating film from the etching bottom portions in the dividing regions with the progress of the etching and continuing the plasma etching process in the state, the exposed insulating film can be charged with positive charge due to the ions in the plasma. By bending the trajectory of the applied ions by the electric charge described above, the sharp corner portions or ridgelines (i.e., the corner portions and the like on the first surface side) of the semiconductor chips put in contact with the insulating film can be removed.

Therefore, all the ridgelines can be removed from the formed semiconductor chips, and the curved convex surface portions can be formed in the positions that correspond to the ridgelines. Moreover, the curved convex surface portions described above can be formed not by the mechanical processing of cutting, abrading or the like but by plasma etching, and this therefore enables the prevention of the occurrence of a residual stress and a damaged layer. Therefore, semiconductor chips, of which the configurational structural strength is improved and the transverse rupture strength is improved can be provided.

Moreover, when the exposed insulating film is formed of silicon oxide or polyimide, the insulating film can be positively etched by performing the plasma etching by changing, for example, the kind of the gas, and the removal can reliably be achieved.

Moreover, when the exposed insulating film is formed of silicon nitride; the exposed insulating film can be etched concurrently with the etching performed for the removal of the corner portions.

Furthermore, by employing an insulating protective sheet as a protective sheet adhesively placed to protect the first surface of the semiconductor wafer, removing the portions that correspond to the dividing regions for the exposure of the insulating protective sheet and thereafter continuing the plasma etching in a state in which the exposed insulating protective sheet is electrically charged, the corner portions of the semiconductor chips can be removed, meaning that an effect similar to the aforementioned effect can be obtained.

Moreover, the plasma etching process is carried out without placing a mask layer on the second surface of the semiconductor wafer, and therefore, labor for carrying out the mask formation process and the removal process can be saved. In particular, the mask layer formation process necessary for the conventional semiconductor wafer dividing method has a high processing cost and is required to have complicated processing. Therefore, by making such a process unnecessary, a low-cost efficient semiconductor chip manufacturing method can be provided.

Moreover, by forming the dividing-groove portions formed on the second surface of the semiconductor wafer so that its depth dimension is not smaller than the thickness dimension of the semiconductor devices that are finally separated into individual pieces, the dividing-groove portions can be removed while allowing the thickness dimension of the semiconductor devices to be obtained by performing the plasma etching, and the separation into the semiconductor devices by the plasma etching accompanied by no mask layer formation (i.e., maskless) can be concretely be achieved.

Moreover, a damaged layer is to be formed by the remaining stress and the like in the neighborhood of the surface of the dividing-groove portions in forming the dividing-groove portions. However, by performing the plasma etching also on the surfaces of the dividing-groove portions and finally removing the dividing-groove portions themselves, the removal of the formed damaged layer can be performed concurrently with the dividing process. Therefore, an efficient semiconductor chip manufacturing method that needs no special processing to be performed for the removal of the damaged layer can be achieved.

Moreover, when an abrading process for reducing the thickness of the semiconductor wafer is carried out on the second surface of the semiconductor wafer, a damaged layer is to be formed in the neighborhood of the second surface due to the abrading process. However, by performing the plasma etching on the entire second surface, removal of the damaged layer can be performed concurrently with the dividing process. Therefore, an efficient semiconductor chip manufacturing method that has no need to provide a process only for removing the damaged layer subsequent to the abrading process and is able to carry out the process concurrently with the plasma etching can be achieved.

Moreover, by forming the dividing-groove portions by means of a dicer that is the device used for the conventional mechanical dividing method, the cost of the total processes can be suppressed.

BRIEF DESCRIPTION OF DRAWINGS

These and other aspects and features of the present invention will become clear from the following description taken in conjunction with the preferred embodiments thereof with reference to the accompanying drawings, in which:

FIG. 3A is a schematic structural view showing a state in which the surface of the lower electrode is charged with negative charge by driving a power unit for electrostatic attraction, and FIG. 3B is a schematic structural view showing a state in which plasma is generated in a processing chamber by driving a high-frequency power unit;

FIG. 8A is a view of a state in which a circuit formation portion and external connection electrodes are formed on the semiconductor wafer, FIG. 8B is a view of a state in which a protective sheet is stuck to the circuit-formation-face of the semiconductor wafer, FIG. 8C is a view of a state in which an abrading process for reducing the thickness of the semiconductor wafer is carried out, and FIG. 8D is a view of a state in which dividing-groove portions are formed on the surface to be processed of the semiconductor wafer;

FIG. 12A is a view of a state in which dividing-groove portions are formed, and

FIG. 12B is a view of a state in which a plasma etching process to form rounded portions on the surface to be processed side and to expose the silicon oxide is carried out;

FIG. 13A is a view of a state in which a plasma etching process for notch formation is carried out, and FIG. 13B is a view of a state in which a silicon oxide removing process is carried out;

FIG. 14A is a view of a state in which a die-bonding sheet is stuck to the surface to be processed of the semiconductor chips, and FIG. 14B is a view of a state in which the protective sheet is peeled off from the circuit-formation-face;

FIG. 15 is a data table showing the plasma processing conditions used for the plasma etching process of a semiconductor wafer;

FIG. 19A is a view of a state in which dividing-groove portions are formed, and

FIG. 19B is a view showing a state in which a plasma etching process for forming rounded portions on the surface to be processed and exposing the polyimide film is carried out;

FIG. 20A is a view of a state in which a plasma etching process for notch formation is carried out, and FIG. 20B is a view of a state in which a polyimide film removing process is carried out;

FIG. 21A is a view of a state in which a die-bonding sheet is stuck to the surface to be processed of the semiconductor chips, and FIG. 21B is a view of a state in which the protective sheet is peeled off from the circuit-formation-face;

FIG. 26A is a view showing a state in which dividing-groove portions are formed, FIG. 26B is a view of a state in which a plasma etching process for forming rounded portions on the surface to be processed and exposing the insulating protective sheet is carried out, and FIG. 26C is a view of a state in which a plasma etching process for notch formation is carried out;

FIG. 27A is a view of a state in which a die-bonding sheet is stuck to the surface to be processed of the semiconductor chips, and FIG. 27B is a view of a state in which the insulating protective sheet is peeled off from the circuit-formation-face;

FIG. 28A is a view of a state before processing is started,

FIG. 28B is a view of a state in which a mask pattern for defining dividing regions is formed, and FIG. 28C is a view of a state in which a plasma dicing process is carried out;

FIG. 29A is a view of a state in which an ashing process is carried out, and

FIG. 29B is a view showing a state in which the protective sheet is peeled off from the circuit-formation-face;

FIG. 31 is a schematic perspective view (including a partial removal cross section) showing the appearance of the semiconductor chip formed by the semiconductor chip manufacturing method of the first embodiment.

DETAILED DESCRIPTION OF THE INVENTION

Figure 1:
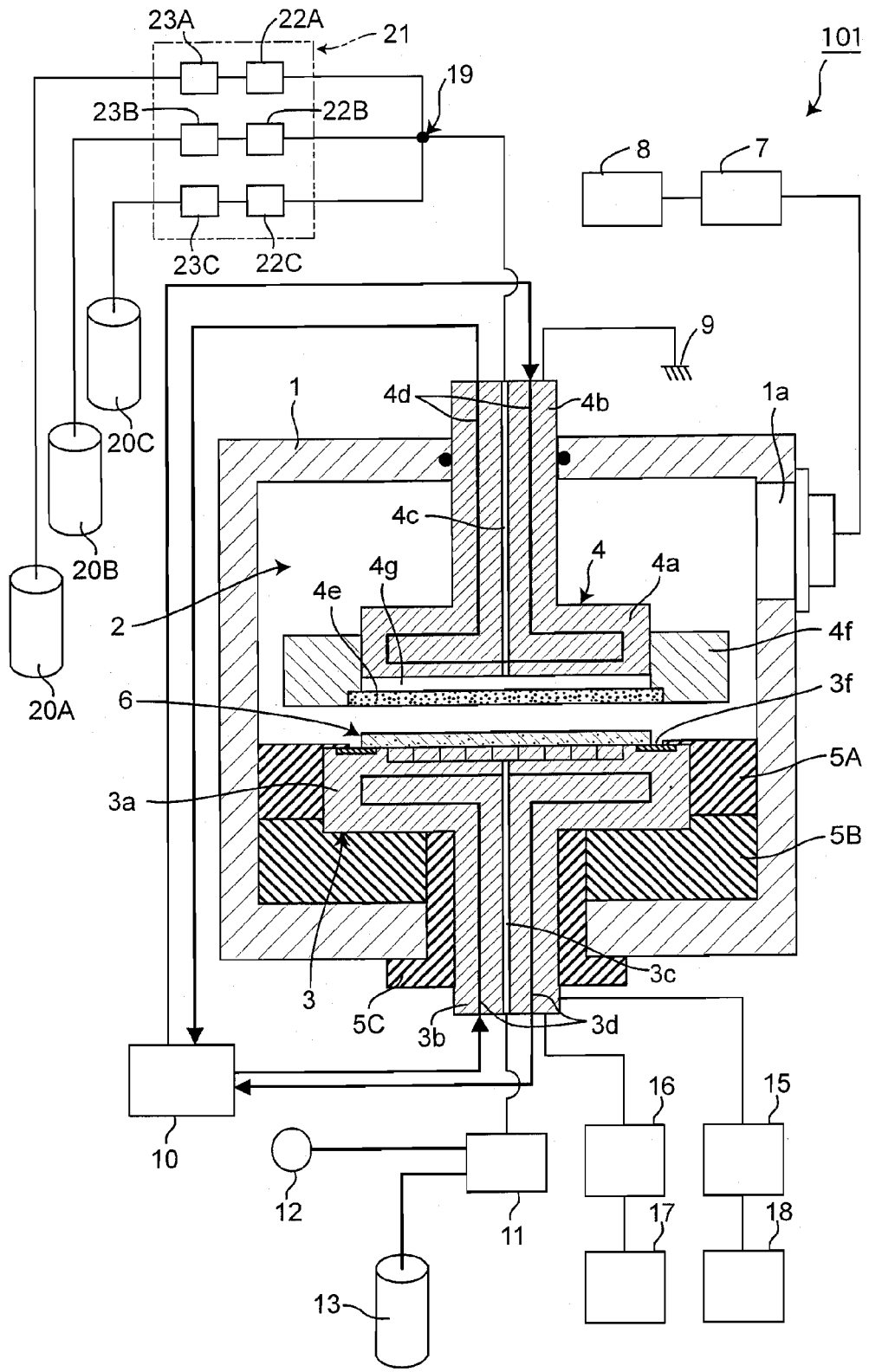
FIG. 1 is a schematic structural view showing the construction of a plasma processing apparatus according to a first embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First Embodiment

Construction of Plasma Processing Apparatus

FIG. 1 shows a schematic structural view that schematically shows the construction of a plasma processing apparatus 101 used for dividing a semiconductor wafer by a manufacturing method for semiconductor chips of the first embodiment of the present invention. It is noted that FIG. 1 is a schematic structural view showing a longitudinal sectional view of the plasma processing apparatus 101. The plasma processing apparatus 101 is the apparatus that manufactures semiconductor chips by dividing a semiconductor wafer, on the circuit-formation-face (first surface) of which a plurality of semiconductor devices are formed, into individual pieces of the semiconductor chips that include the semiconductor devices.

Moreover, in a series of semiconductor chip manufacturing processes as described above, a protective sheet made of, for example, a material that is less plasma etchable than silicon that is the principal material of the semiconductor wafer is stuck to the circuit-formation-face (i.e., the surface located on the side where the devices are formed) of the semiconductor wafer where the semiconductor devices are formed in the device-formation-regions defined by the dividing regions arranged roughly in a grating form, and a plasma etching process (plasma processing) such as plasma dicing is carried out on the surface to be processed (second surface) that is the surface located opposite from the circuit-formation-face by the present plasma processing apparatus 101.

The construction of the plasma processing apparatus 101 is concretely described with reference to FIG. 1.

In the plasma processing apparatus 101 of FIG. 1, the inside of a vacuum chamber 1 serves as a processing chamber 2 for carrying out processing of the objective semiconductor wafer and is able to form a sealed space for generating plasma under a reduced pressure. A lower electrode 3 (first electrode) is placed on the lower side inside the processing chamber 2, and an upper electrode 4 (second electrode) is placed above the lower electrode 3 and oppositely to the lower electrode 3. The electrode 3 and the upper electrode 4 have a roughly cylindrical shape and are concentrically arranged in the processing chamber 2.

The lower electrode 3 is placed in a state in which its periphery is surrounded by insulating members 5A and 5B that are two layers mounted to fill up the bottom portion of the processing chamber 2 and its upper surface for retaining the object to be processed is fixed exposed at the center portion of the bottom portion of the processing chamber 2. The lower electrode 3 is made of a conductor such as aluminum and includes a disk-shaped electrode portion 3a for retaining the object to be processed and a columnar support portion 3b that protrudes downward from the lower surface of the electrode portion 3a and whose one end is formed exposed outside the vacuum chamber 1 in an integrated state. Moreover, the support portion 3b is held by the vacuum chamber 1 via an insulating member 5C, and the lower electrode 3 is attached to the vacuum chamber 1 in a state in which it is electrically insulated by being thus retained.

The upper electrode 4 is made of a conductor such as aluminum similar to the lower electrode 3 and includes a disk-shaped electrode portion 4a and a columnar support portion 4b that protrudes upward from the upper surface of the electrode portion 4a and whose one end is formed exposed outside the vacuum chamber 1 in an integrated state. Moreover, the support portion 4b is electrically continued to the vacuum chamber 1 and made elevatable by an electrode elevation unit 24 (see FIG. 16). By the electrode elevation unit 24, the upper electrode 4 is made elevatable between a wafer loading/unloading position that is the upper end position of the elevation and where a large space for loading and unloading a semiconductor wafer between it and the lower electrode 3 is formed and a discharge space formation position that is the lower end position of the elevation and where a discharge space for generating plasma discharge for plasma processing is formed between the upper electrode 4 and the lower electrode 3. The electrode elevation unit 24 functions as an inter-electrode distance changing means and an interelectrode distance D (see FIG. 2) between the lower electrode 3 and the upper electrode 4 can be set to a desired value by moving up and down the upper electrode 4.

The detailed structure of the lower electrode 3 and the semiconductor wafer of the object to be processed are described next. As shown in FIG. 1, the upper surface of the electrode portion 3a of the lower electrode 3 is a planar retention surface (one example of the retention portion) on which a semiconductor wafer 6 is placed, and an insulating coating layer 3f is provided around the entire circumference of the outer edge portion of the retention surface. The insulating coating layer 3f is formed of ceramic such as alumina, and the outer edge portion of the insulating coating layer 3f is partially covered with an insulating member 5A as shown in FIG. 1 in a state in which the lower electrode 3 is mounted inside the vacuum chamber 1. The outer edge portion of the lower electrode 3 is insulated from the plasma generated in the discharge space by having the structure, and abnormal electrical discharge can be prevented from being generated.

Figure 2:
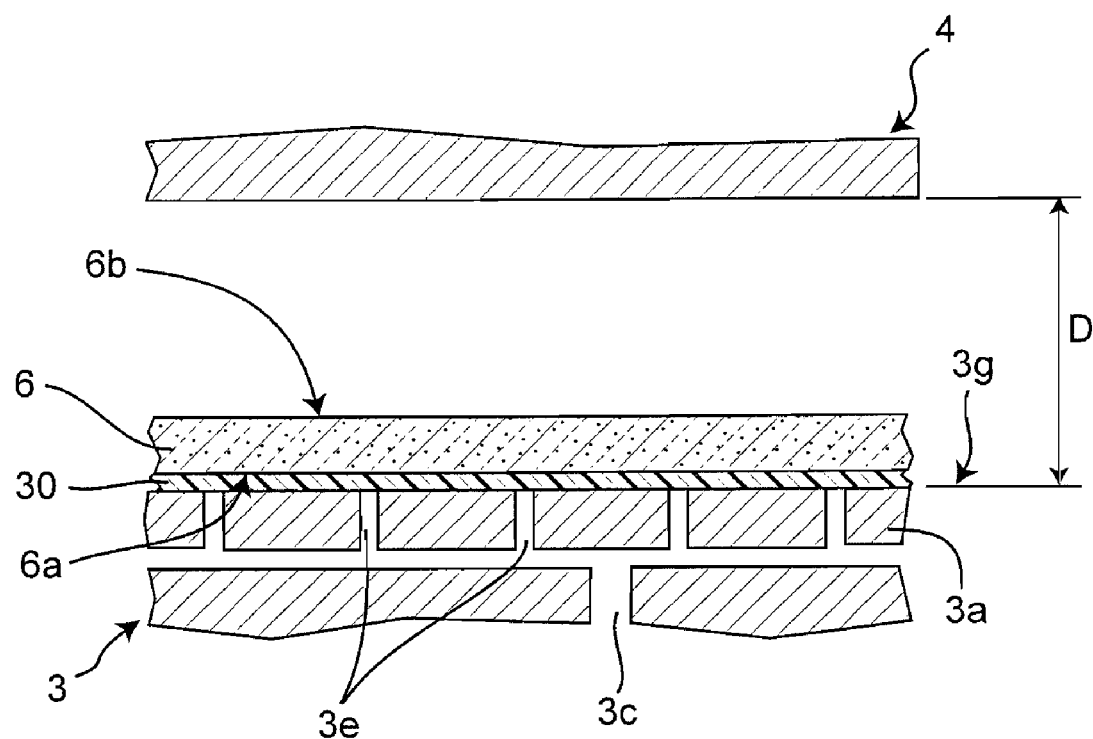
FIG. 2 is a partially enlarged sectional view of the lower electrode of the plasma processing apparatus of FIG. 1.

FIG. 2 is a partial schematic sectional view showing a state in which the semiconductor wafer 6 is placed on the lower electrode 3 before plasma dicing is started. The semiconductor wafer 6 is a semiconductor substrate made of a principal material of, for example, silicon, and a protective sheet 30 is adhesively stuck to a circuit-formation-face 6a (first surface) of the surface (lower surface side in FIG. 2) of the semiconductor wafer 6. In a state in which the semiconductor wafer 6 is placed on a retention surface 3g of the electrode portion 3a that is the upper surface of the lower electrode 3, the protective sheet 30 is to closely adhere to the retention surface 3g.

The protective sheet 30 has a construction that includes an insulating layer obtained by forming an insulating film such as polyimide into a film of a thickness of about 100 μm and is peelably stuck to the circuit-formation-face 6a of the semiconductor wafer 6 with an adhesive material. When the semiconductor wafer 6 to which the protective sheet 30 is stuck is retained on the lower electrode 3, the insulating layer functions as a dielectric in electrostatically attracting the semiconductor wafer 6 by the retention surface 3g of the electrode portion 3a as described later.

Moreover, with regard to the material of the protective sheet 30, it is preferable to select a material that is less etchable than silicon that is the principal material of the semiconductor wafer 6 during the plasma dicing described later.

Moreover, as shown in FIG. 2, the lower electrode 3 has a plurality of attraction holes 3e that open on the retention surface 3g, and the attraction holes 3e communicate with a suction hole 3c provided in the lower electrode 3. As shown in FIG. 1, the suction hole 3c is connected to a vacuum suction pump 12 via a gas line switchover valve 11, and the gas line switchover valve 11 is connected to an $N_2$ gas supply unit 13 that supplies $N_2$ gas. By switching the gas line switchover valve 11, the suction hole 3c can be selectively connected to the vacuum suction pump 12 or the $N_2$ gas supply unit 13.

By selecting the vacuum suction pump 12 by the gas line switchover valve 11 and driving the vacuum suction pump 12 in a state in which the suction hole 3c communicates with the vacuum suction pump 12, the semiconductor wafer 6 placed on the lower electrode 3 can be held by vacuum attraction by effecting vacuum suction through the attraction holes 3e. Therefore, the attraction holes 3e, the suction hole 3c and the vacuum suction pump 12 serve as vacuum suction means for retaining the semiconductor wafer 6 by vacuum attraction in a state in which the protective sheet 30 is closely fit to the retention surface 3g of the electrode portion 3a by effecting suction through the attraction holes 3e that open on the retention surface 3g of the lower electrode 3.

Moreover, by selecting the $N_2$ gas supply unit 13 by the gas line switchover valve 11 and connecting the suction hole 3c to the $N_2$ gas supply unit 13, the $N_2$ gas can be gushed through the attraction holes 3e against the lower surface of the protective sheet 30. The $N_2$ gas is the gas for blowing purpose intended for compulsorily separating the protective sheet 30 from the retention surface 3g as described later.

Moreover, as show in FIG. 1, a refrigerant passage 3d for cooling use is provided in the lower electrode 3, and the refrigerant passage 3d is connected to a cooling unit 10. By driving the cooling unit 10, a refrigerant such as cooling water circulates in the refrigerant passage 3d, by which the semiconductor wafer 6 is cooled via the lower electrode 3 and the protective sheet 30 on the lower electrode 3 of which the temperatures are raised by heat generated during the plasma processing. It is noted that the refrigerant passage 3d and the cooling unit 10 serve as cooling means for cooling the lower electrode 3.

Moreover, in the plasma processing apparatus 101 of FIG. 1, a vacuum pump 8 is connected via an exhaust switchover valve 7 to an exhaust port la provided communicating with the processing chamber 2. By driving the vacuum pump 8 by switching the exhaust switchover valve 7 to the exhaust side, the processing chamber 2 of the vacuum chamber 1 is internally evacuated, allowing the processing chamber 2 to be internally decompressed. Moreover, the processing chamber 2 has a pressure sensor 28 (not shown in FIG. 1, see FIG. 4), and by controlling the vacuum pump 8 by a control unit 33 (see FIG. 4) described later on the basis of the pressure measurement result of the pressure sensor 28, the processing chamber 2 can be internally decompressed to the desired pressure. The vacuum pump 8 for decompression to the desired pressure can be controlled by directly controlling the evacuation ability of the vacuum pump 8 itself by using, for example, a variable capacity type as the vacuum pump 8 or providing an opening regulating valve (butterfly valve etc.) in the evacuation path and indirectly controlling the evacuation ability by controlling the opening. It is noted that the vacuum pump 8 and the exhaust switchover valve 7 serve as an evacuation unit (decompression means) that internally decompresses the processing chamber 2 to the desired pressure. Moreover, by switching the exhaust switchover valve 7 to the atmospheric open side, the atmosphere is introduced into the processing chamber 2 through the exhaust port la, allowing the internal pressure of the processing chamber 2 to be restored to the atmospheric pressure.

The detailed structure of the upper electrode 4 is described next. The upper electrode 4 has a center electrode portion 4a and an annular member 4f constructed of an insulating film provided fixed to the outer peripheral portion of the electrode so as to surround the electrode portion 4a. The annular member 4f has an inside diameter made approximately equal to the outside diameter of the electrode portion 4a of the upper electrode 4 and is concentrically arranged in a shape that expands outwardly of the circumferential surface of the lower electrode 3. The annular member 4f plays the role of holding a disk-shaped gas blowing portion 4e placed in a lower center portion of the upper electrode 4.

The gas blowing portion 4e supplies a plasma generating gas for generating plasma discharge in the discharge space formed between the upper electrode 4 and the lower electrode 3. The gas blowing portion 4e is a member obtained by processing a porous material that internally has many micropores into a disk-like shape and is able to supply in a uniform state the plasma generating gas supplied into a gas retention space 4g, which is surrounded by the lower surface of the electrode portion 4a of the upper electrode 4, the upper surface of the gas blowing portion 4e and the inner peripheral surface of the annular member 4f, by making the gas uniformly blow into the discharge space via the micropores.

A gas supply hole 4c that communicates with the gas retention space 4g is provided in the support portion 4b, and the gas supply hole 4c is connected to a plasma generating gas supply unit placed outside the vacuum chamber 1. The plasma generating apparatus has a first gas supply unit 20A, a second gas supply unit 20B and a third gas supply unit 20C as a plurality of gas supply units that individually supply gases of different kinds, a gas mixing portion (junction of piping) 19 to mix the gasses supplied from the gas supply units 20A, 20B and 20C and put the gas composition into a uniform state, and a gas flow rate regulating section 21 that is placed between the gas mixing portion 19 and the gas supply units 20A, 20B and 20C and individually regulates the supply flow rates of the gases supplied to the gas mixing portion 19.

The gas flow rate regulating section 21 has a first flow rate control valve 23A that independently regulates the flow rate of the gas supplied from the first gas supply unit 20A, a first on/off valve 22A capable of interrupting the gas supply, a second flow rate control valve 23B that independently regulates the flow rate of the gas supplied from the second gas supply unit 20B, a second on/off valve 22B capable of interrupting the gas supply, a third flow rate control valve 23C that independently regulates the flow rate of the gas supplied from the third gas supply unit 20C and a third on/off valve 22C capable of interrupting the gas supply. The opening control and the on/off control of the valves are executed by the control unit 33 described later.

The plasma processing apparatus 101 of the present first embodiment is able to supply, for example, a sulfur hexafluoride gas ($SF_6$) from the first gas supply unit 20A, oxygen ($O_2$) from the second gas supply unit 20B and trifluoromethane ($CHF_3$) from the third gas supply unit 20C. The plasma generating gas supply units constructed as above make it possible to individually regulate the flow rate of the gas(es) supplied from one or a plurality of gas supply units selected from the gas supply units 20A, 20B and 20C by the gas flow rate regulating section 21, supply a mixed gas (or single gas) of the desired gas composition and flow rate to the gas mixing portion 19 and supply the gas (mixed gas) mixed in the gas mixing portion 19 into the discharge space through a gas supply hole 4c, a gas retention space 4g and a gas blowing portion 4e.

Moreover, by changing only the supply flow rate without changing the gas composition, i.e., the gas supply ratio by using the function of the gas flow rate regulating section 21 that can individually regulate the flow rate of each gas, the internal pressure of the processing chamber 2 can be controlled. By controlling the gas flow rate regulating section 21 by the control unit 33 on the basis of a preset pressure condition and the internal pressure of the processing chamber 2 detected by the pressure sensor 28, the internal pressure of the processing chamber 2 can be regulated to coincide with the pressure condition. Therefore, the gas flow rate regulating section 21 concurrently has the function of regulating the composition of the gas supplied into the processing chamber 2 and the function of controlling the internal pressure of the processing chamber 2.

Moreover, as shown in FIG. 1, the lower electrode 3 is electrically connected to a high-frequency power unit 17 via a matching circuit 16. By driving the high-frequency power unit 17, a high-frequency voltage is applied between the upper electrode 4 that is electrically continued to the vacuum chamber 1 grounded to a grounding portion 9 and the lower electrode 3. As a result, plasma discharge is generated in the discharge space between the upper electrode 4 and the lower electrode 3 in the processing chamber 2, and the plasma generating gas supplied into the processing chamber 2 makes a transition to the plasma state. Moreover, the matching circuit 16 has the function of matching the impedance of the plasma discharge circuit in the processing chamber 2 with the high-frequency power unit 17 at the time of generating plasma. In the present embodiment, the high-frequency power unit 17 and the matching circuit 16 serve as one example of the high-frequency power applying device.

Further, a DC power unit 18 for electrostatic attraction is connected to the lower electrode 3 via an RF filter 15. By driving the DC power unit 18 for electrostatic attraction, the surface of the lower electrode 3 is charged with negative charge (indicated by "−" in the FIG.) as shown in the schematic view of the plasma processing apparatus 101 of FIG. 3A. As shown in the schematic view of the plasma processing apparatus 101 of FIG. 3B, if a plasma 34 (indicated by the dotted portion in the FIG.) is generated in the processing chamber 2 by driving the high-frequency power unit 17 in this state, a direct current application circuit 32 that connects the semiconductor wafer 6 placed on the retention surface 3g via the protective sheet 30 to the grounding portion 9 is formed via the plasma 34 in the processing chamber 2. As a result, a closed circuit that sequentially connects the lower electrode 3, the RF filter 15, the DC power unit 18 for electrostatic attraction, the grounding portion 9, the plasma 34 and the semiconductor wafer 6 is formed, and the semiconductor wafer 6 is charged with positive charge (indicated by "+" in the FIG.).

Then, a Coulomb force takes effect between the negative charge "−" in the retention surface 3g of the lower electrode 3 formed of a conductor and the positive charges "+" in the semiconductor wafer 6 via the protective sheet 30 that includes an insulating layer as a dielectric, so that the semiconductor wafer 6 is retained on the lower electrode 3 by the Coulomb force. At this time, the RF filter 15 prevents the radio-frequency voltage of the radio-frequency power unit 17 from being applied directly to the DC power unit 18 for electrostatic attraction. It is noted that the polarity of the DC power unit 18 for electrostatic attraction may be reversed. As described above, in the plasma processing apparatus 101, the components that substantially contribute to the generation of the plasma can also be referred to as a plasma generating apparatus.

Moreover, in the above construction, the DC power unit 18 for electrostatic attraction serves as an electrostatic attraction means for electrostatically attracting the semiconductor wafer 6 by utilizing the Coulomb force that takes effect between the semiconductor wafer 6 and the retention surface 3g of the lower electrode 3, which are separated by the protective sheet 30, by applying a DC voltage to the lower electrode 3. That is, with regard to the retention means for retaining the semiconductor wafer 6 on the lower electrode 3, the two types of the vacuum suction means for vacuum attraction of the protective sheet 30 via the plurality of attraction holes 3e that open on the retention surface 3g and the electrostatic attraction means can properly be used.

Moreover, a refrigerant passage 4d for cooling use is provided in the upper electrode 4 as in the lower electrode 3, and the refrigerant passage 4d is connected to the cooling unit 10. A refrigerant such as cooling water circulates in the refrigerant passage 4d by driving the cooling unit 10, and this makes it possible to cool the upper electrode 4 whose temperature has been elevated by heat generated during the plasma processing.

Figure 16:
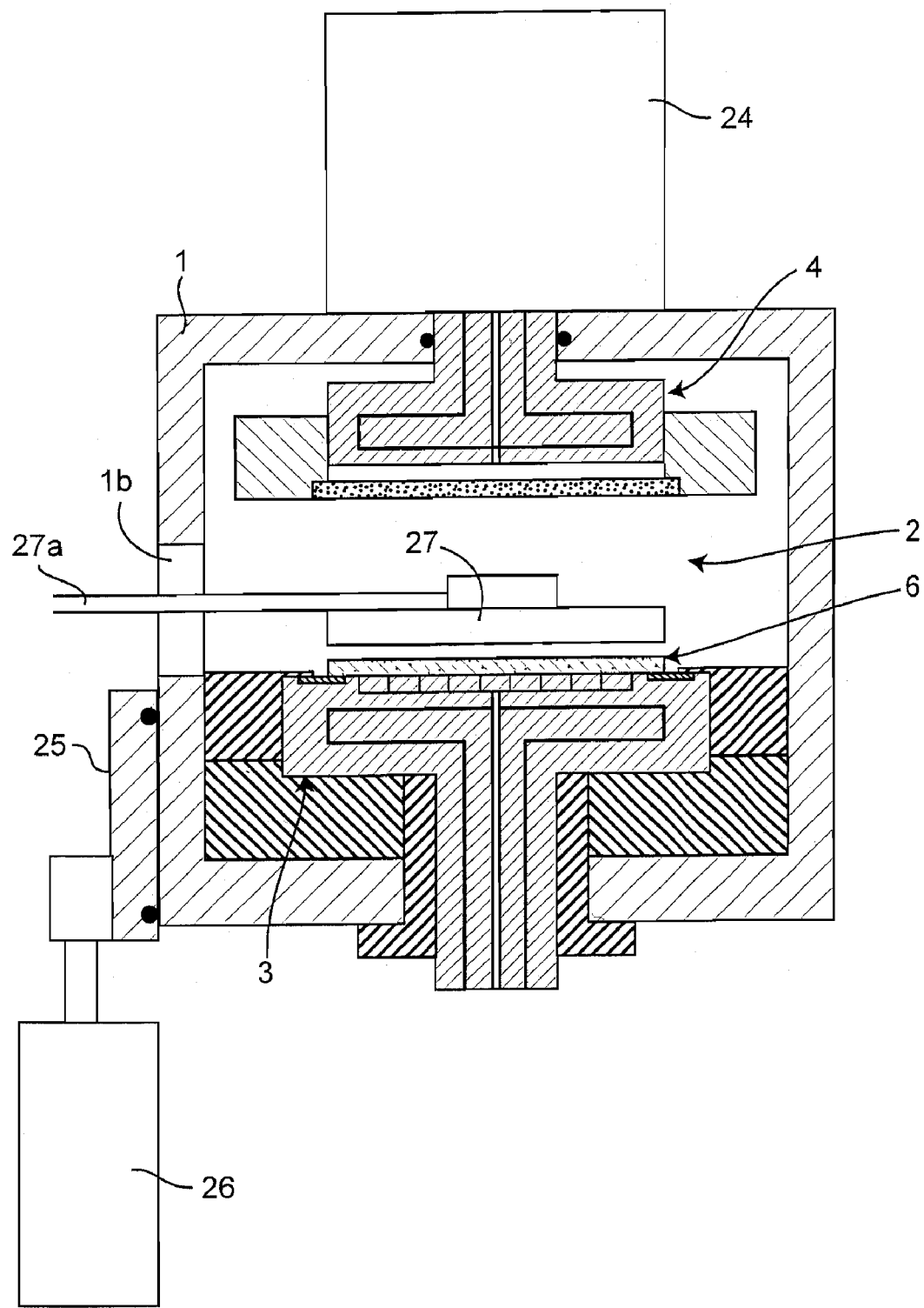
FIG. 16 is a schematic sectional view of the plasma processing apparatus in a state in which a semiconductor wafer is loaded.

Moreover, an opening 1b for loading and unloading the semiconductor wafer 6 that is the object to be processed is provided on the side surface of the processing chamber 2 (see FIG. 16). A door 25 that is moved up and down by a door opening/closing unit 26 is provided outside the opening 1b, and the opening 1b is opened and closed by moving up and down the door 25. FIG. 16 shows a state in which the semiconductor wafer 6 is loaded and unloaded with the opening 1b opened by moving down the door 25 by the door opening/closing unit 26.

Moreover, as shown in FIG. 16, a space for conveyance use is secured between the upper electrode 4 and the lower electrode 3 by moving up the upper electrode 4 by the electrode elevation unit 24 to position the electrode in the wafer loading/unloading position during the loading and unloading of the semiconductor wafer 6. In this state, a suction head 27 that is sucking and holding the semiconductor wafer 6 is made to enter the processing chamber 2 via the opening 1b by operating an arm 27a. By this operation, the loading of the semiconductor wafer 6 onto the lower electrode 3 and the unloading of the processed semiconductor wafer 6 (semiconductor devices) are performed.

Construction of Control System

The construction of the control system of the plasma processing apparatus 101 that has the above construction is described next with reference to the block diagram of the control system shown in FIG. 4.

Figure 4:
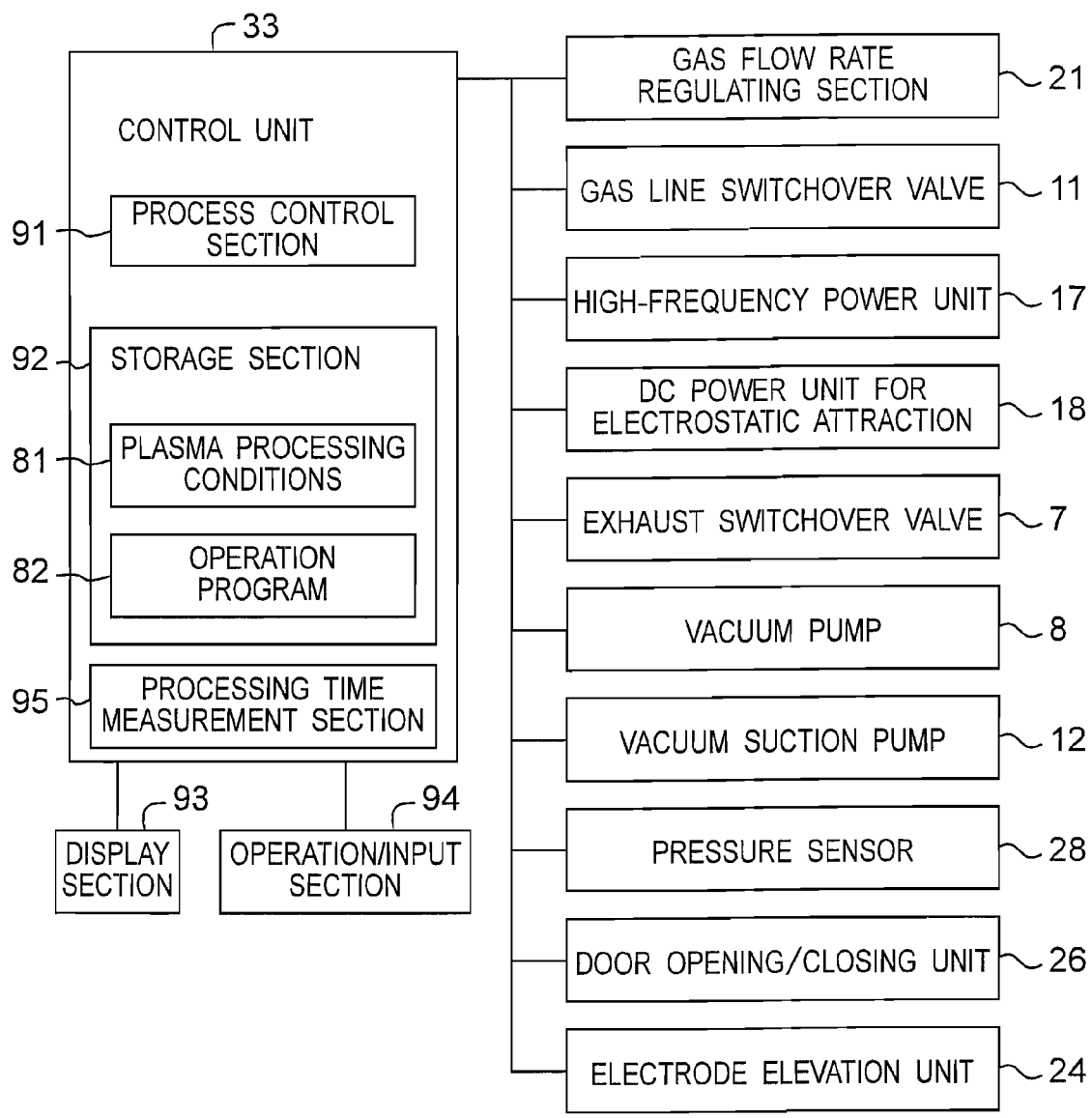
FIG. 4 is a control block diagram showing the construction of the control system of the plasma generating apparatus of FIG. 1.

As shown in FIG. 4, the control unit 33 has a storage section 92 that stores various data and a processing program and a process control section 91 that executes control of the plasma processing by executing the operation control of the components of the plasma processing apparatus 101 on the basis of these data and processing program. The storage section 92 stores plasma processing conditions 81 (allowed to be plasma conditions or operating conditions) and an operation program 82 of the plasma processing, and the process control section 91 executes control of the plasma processing on the basis of the operation program 82 and the plasma processing conditions 81. An operation/input section 94 is the input means such as a keyboard and executes data input of the plasma processing conditions and so on and input of operating commands. A display section 93 is a display device, which displays a guide screen and so on at the time of operation input. Although not shown, it may be a case where the control unit 33 has an external input/output interface and exchange of information with the outside of the device is performed.

In this case, the plasma processing conditions used in the plasma processing apparatus 101 of the present first embodiment are herein described. The plasma processing carried out in the present first embodiment roughly includes two processing steps, which are a plasma dicing process (or plasma etching process) and an insulator removal process as described later. Moreover, in the plasma dicing process, three processing steps of a second corner portion removal process, an insulator exposure process and a first corner portion removal process (or notch formation process) are carried out by performing plasma etching as described later, and plasma processing conditions 81 for carrying out the processing steps are preliminarily individually determined. The plasma processing conditions 81 are determined by combinational conditions of, for example, the gas composition of the plasma generating gas, the pressure inside the processing chamber 2 and a high frequency (discharge frequency) applied between the upper electrode 4 and the lower electrode 3. It is noted that the second corner portion removal process and the insulator exposure process are roughly concurrently carried out in the present embodiment.

Moreover, according to the semiconductor wafer manufacturing method of the present first embodiment, the second corner portion removal process, the insulator exposure process and the first corner portion removal process should preferably be carried out on the same plasma processing conditions, or, for example, anisotropic etching that has a more intense etching characteristic in the direction of thickness than in the direction along the surface of the semiconductor wafer 6 (i.e., etching characteristic principally effected in the direction of thickness) as the plasma etching.

One example of the plasma processing conditions 81 as described above is shown in the data table of FIG. 15. As shown in FIG. 15, plasma processing conditions 81A for the anisotropic etching for the second corner portion removal process, the insulator exposure process and the first corner portion removal process, i.e., for a plasma dicing process are provided by the combinational conditions that the gas composition of the mixed gas (i.e., mixture ratio of the gases) is constituted of $SF_6$ and $O_2$ at a ratio of 10:2, the pressure is 100 Pa and the frequency is 60 MHz. Moreover, when, for example, silicon oxide ($SiO_2$) is used as an insulating film as described later, plasma processing conditions 81B for the insulating film removing process are provided by the combinational conditions that the gas composition is constituted of $CHF_3$ at a ratio of 20, the pressure is 50 Pa and the frequency is 13.56 MHz. It is noted that there is an interelectrode distance D between the upper electrode 4 and the lower electrode 3, and, for example, a value (assumed to be an interelectrode distance D1) considered to be optimum within a range of 5 to 50 mm as the interelectrode distance D is set for the plasma processing conditions 81A and 81B. Moreover, the plasma processing conditions 81A and 81B include the condition of the processing execution time.

Moreover, as the gas composition for the anisotropic etching, it is preferable to use a gas composition such that a reaction product that easily deposits (deposition: vapor deposition or deposition). For example, a fluorine oxide of silicon ($Si_xF_yO_z$) (x, y and z are integers in this case) can be generated as the reaction product by using a gas composition that includes oxygen as the gas composition for the anisotropic etching. The fluorine oxide has a characteristic that it is less etchable than silicon. Taking advantage of the characteristic allows, for example, the groove portions to be formed on the surface of the semiconductor wafer by performing the anisotropic etching and allows the film to be formed on the inner surface side of the formed groove portions by making the generated fluorine oxide adhere to the surface (sidewall deposition). On the other hand, the fluorine oxide does not easily adhere to the bottom surfaces of the groove portions by physical etching with accelerated ions. For the above reasons, the inner surfaces of the groove portions can be made less etchable than the bottom surfaces, and this consequently allows the etching to produce an intense effect in the direction of thickness of the semiconductor wafer, so that more ideal anisotropic etching can be achieved. Therefore, it is preferable to use the gas composition that promotes the anisotropic etching, i.e., the gas composition that easily causes sidewall deposition as the gas composition for the anisotropic etching.

The plasma processing conditions 81A for the anisotropic etching and the plasma processing conditions 81B for the insulating film removing process are stored in the storage section 92 of the control unit 33. The plasma processing conditions 81 necessary for each process are selected on the basis of the operation program 82, and the plasma processing is carried out by the process control section 91 on the basis of the selected plasma processing conditions 81.

During the plasma processing carried out on the basis of the operation program 82, as shown in FIG. 4, the components, which are the gas flow rate regulating section 21, the gas line switchover valve 11, the high-frequency power unit 17, the DC power unit 18 for electrostatic attraction, the exhaust switchover valve 7, the vacuum pump 8, the vacuum suction pump 12, the door opening/closing unit 26 and the electrode elevation unit 24, are controlled by the process control section 91.

Moreover, by regulating the total supply amount of the gases by controlling the gas flow rate regulating section 21 by the process control section 91 on the basis of the pressure detection result by the pressure sensor 28, the internal pressure of the processing chamber 2 can be controlled to coincide with the plasma processing conditions 81.

Further, as shown in FIG. 4, the control unit 33 has a processing time measurement section 95, which measures the processing time of the plasma processing and executes control such that, when the measurement result reaches the condition of the processing time included in the plasma processing conditions 81, control to end the processing by the process control section 91 can be performed.

The principle of the plasma etching processing method used in the present first embodiment, and in particular, the principle used in the first corner portion removal process (notch formation process) is described next with reference to the partially enlarged schematic explanatory views in the neighborhood of the dividing regions of the semiconductor wafer 6 shown in FIGS. 5 and 6.

Figure 5:
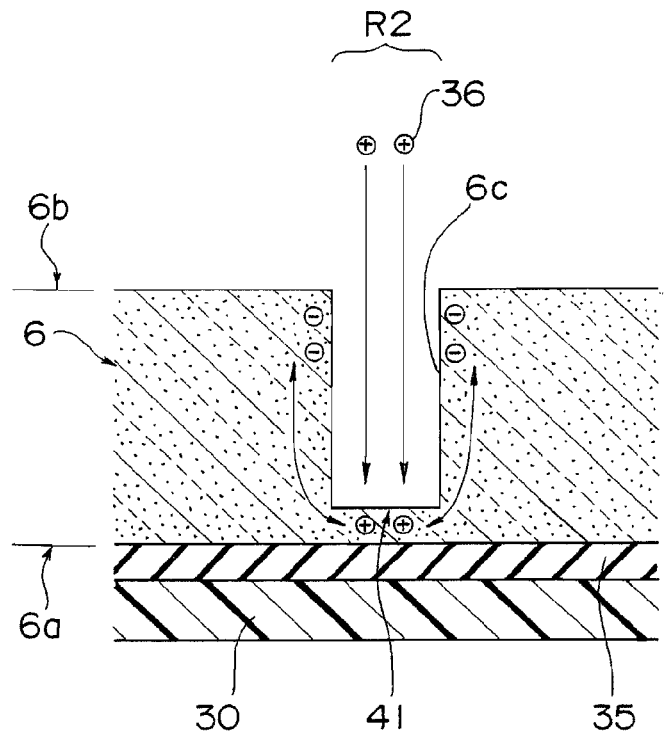
FIG. 5 is a schematic explanatory view for explaining part of the principle of a plasma dicing process method used in the first embodiment, showing a state in which the insulating film is not exposed from an etching bottom portion.

FIG. 5 is a view showing a state in which the plasma etching process is carried out on the portions that correspond to the dividing regions R2 from the surface 6b to be processed on the semiconductor wafer 6, that is the processing-target-face 6b, to the circuit-formation-face 6a to which the protective sheet 30 is adhesively stuck. Moreover, as shown in FIG. 5, the semiconductor wafer 6 used in the present first embodiment is the semiconductor wafer on the circuit-formation-face 6a of which the silicon oxide film 35 formed of silicon oxide ($SiO_2$) of one example of the insulating film is formed also in the portions that correspond to the dividing regions. The semiconductor wafer has a construction different from that of the conventional semiconductor wafer on which no such silicon oxide is formed in the portions that correspond to the dividing regions. It is noted that the protective sheet 30 is adhesively stuck to the circuit-formation-face 6a located on the thus-formed silicon oxide 35 side.

As shown in FIG. 5, the ions in the plasma are made roughly perpendicularly incident on the semiconductor wafer 6 by an electric field generated in the plasma processing apparatus 101, and the incident ions reach the bottom portion (etching bottom portion) of a groove portion formed by an etching process, promoting the etching. The ions (having positive charge) that have reached the etching bottom portion are recombined with electrons in the semiconductor wafer 6 formed of silicon that is the semiconductor material. That is, since the silicon material also has characteristics as a conductor, the ions that have reached the etching bottom portion and have positive charge are recombined with the electrons in the semiconductor wafer 6 due to an electric continuity between the etching bottom portion and the inside of the semiconductor wafer 6. The etching bottom portion is not charged with positive charge so long as the electric continuity is achieved.

Figure 6:
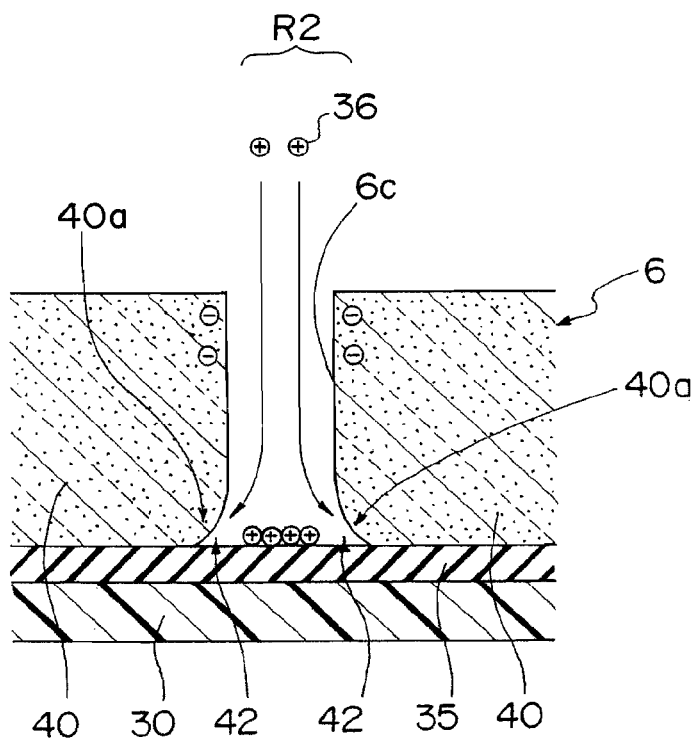
FIG. 6 is a schematic explanatory view for explaining part of the principle of the plasma dicing process method used in the first embodiment, showing a state in which notch formation is carried out with the insulating film exposed from the etching bottom portion.

On the other hand, as shown in FIG. 6, when a state in which the etching pr ogresses to remove the etching bottom portion and expose the surface of the silicon oxide film 35, no electric continuity is achieved between the exposed silicon oxide film 35 and the inside of the semiconductor wafer 6, and therefore, the silicon oxide film 35 exposed by the reach of the ions is surface charged (electrically charged) with positive charge for the charging of the positive charge. When the state in which the thus exposed silicon oxide film 35 is charged with the positive charge, ions that enter next loose the straightness thereof due to the electric fields of positive charges, and the track (trajectory) thereof is to be bent. Consequently, as shown in FIG. 6, the ions reach both corner portions of the groove portion, so that etching is performed at both corner portions, and removed portions of a shape that is called notch where the groove portion is sharply expanded in the widthwise direction at the bottom portions are formed. This is the principle of the plasma etching process method used in the present first embodiment.

By thus forming the notches at the bottom portions of the groove portion, removal of the corner portions of the separated semiconductor chips, or, for example, formation of rounded (R) portions that are curved convex surface portions when viewed from the semiconductor wafer 6 side, or the side to be etched can be achieved (first corner portion removal process). Moreover, with regard to the principle of the plasma processing method as described above, it is preferable to perform anisotropic etching so that the ions in the applied plasma easily reach the etching bottom portions in the state shown in FIG. 5, i.e., in the state in which the silicon oxide film 35 is not exposed, and the anisotropic etching is also performed in the insulator exposure process of the first embodiment. Moreover, a processing time necessary for exposing the silicon oxide film 35 (i.e., processing time of the insulator exposure process) and a processing time (i.e., processing time of the first corner portion removal process) necessary for forming notches of a prescribed size (i.e., removing the corner portions, such as chamfering and rounded portion formation) after the exposure of the silicon oxide film 35 in the plasma dicing process are included in the plasma processing conditions 81A.

Semiconductor Chip Manufacturing Method

A series of manufacturing processes of semiconductor chips including the dividing process of the semiconductor wafer 1 using the plasma processor 101 of the above construction is described next. For the description, a flow chart showing the procedure of the manufacturing steps of the semiconductor devices is shown in FIG. 7, and a schematic explanatory view for explaining part of the manufacturing steps of the semiconductor devices is shown in FIGS. 8A through 8D.

Figure 7:
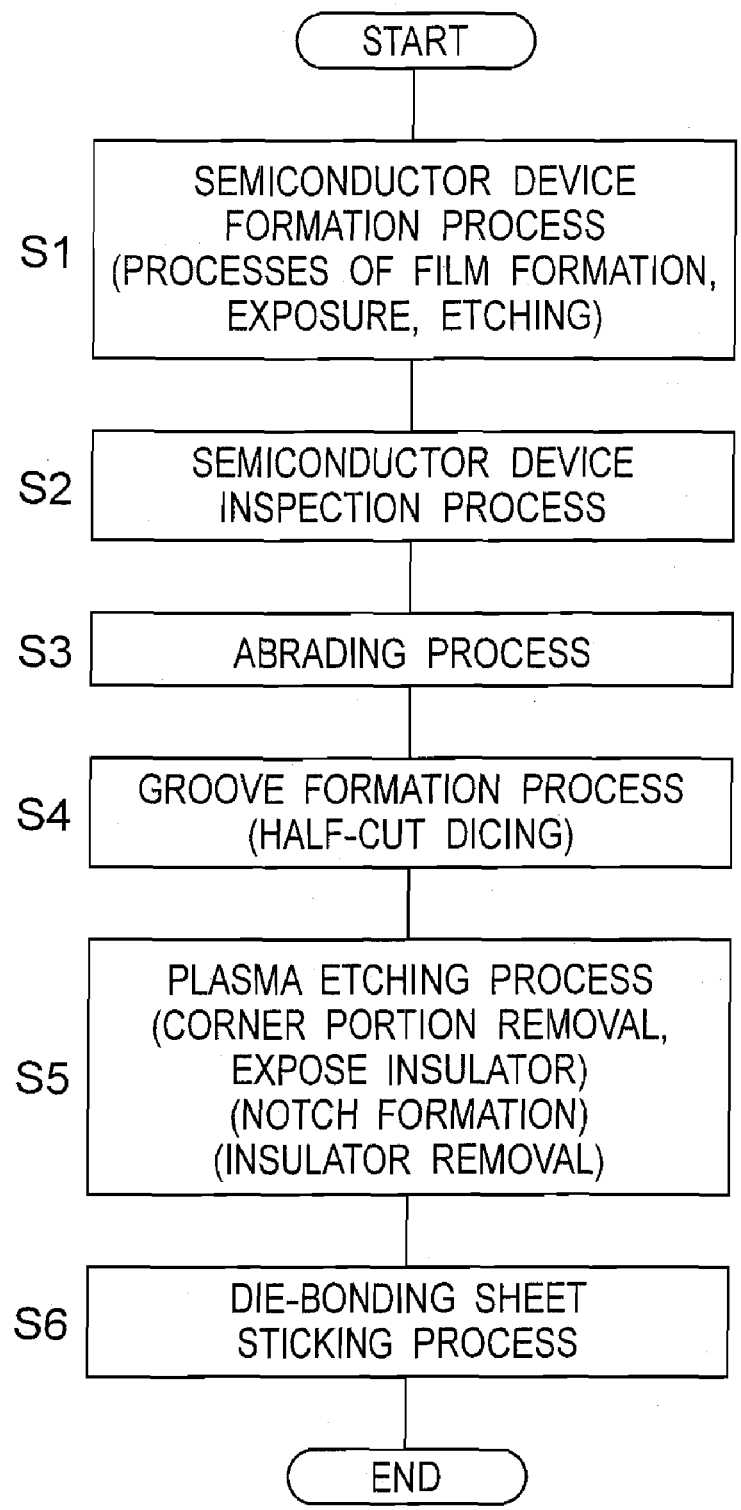
FIG. 7 is a flow chart showing the procedure of a semiconductor chip manufacturing method of the first embodiment.
Figure 8A:
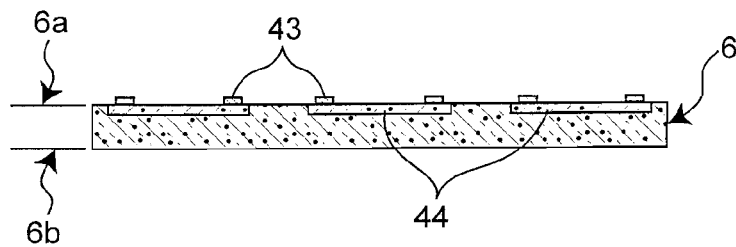
FIGS. 8A through 8D are schematic explanatory views for explaining the semiconductor chip manufacturing method of FIG. 7, where.
Figure 8B:
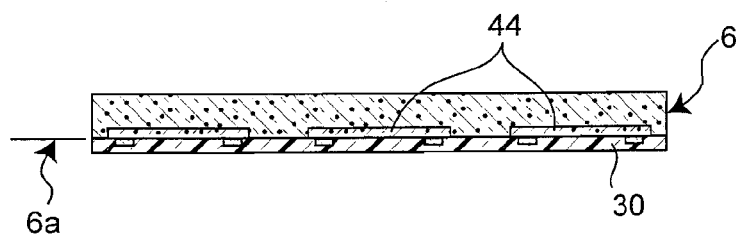

First of all, by carrying out the processing of film formation, exposure, etching and the like on the circuit-formation-face 6a that is the first surface of the semiconductor wafer 6 as shown in FIG. 8A in step S1 of the flow chart of FIG. 7, a plurality of semiconductor devices 44 are formed (semiconductor device formation process). In this case, a partially enlarged schematic view of the semiconductor wafer 6 shown in FIG. 8A is shown in FIG. 9.

Figure 9:
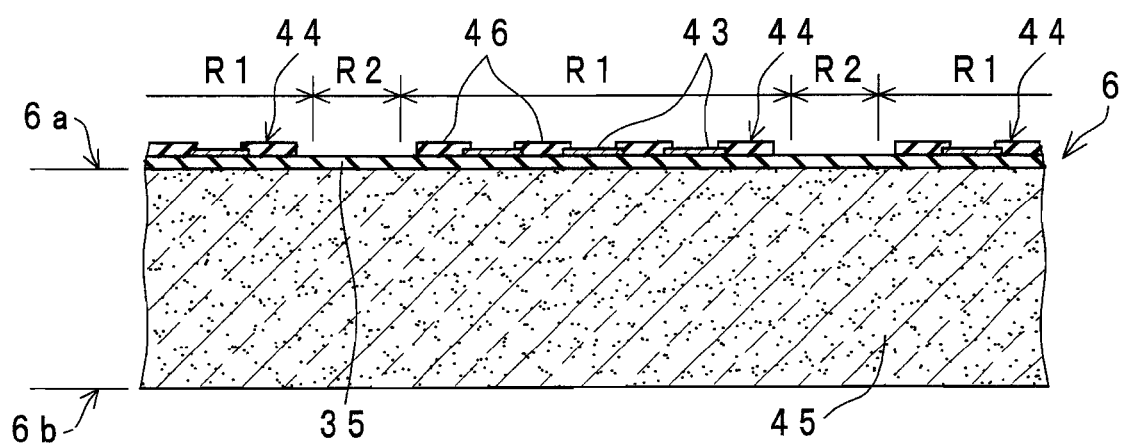
FIG. 9 is a partially enlarged schematic sectional view of the semiconductor wafer of the first embodiment.

As shown in FIG. 9, the semiconductor wafer 6 has a disk-like shape, and a plurality of device-formation-regions R1 are arranged in a matrix form on its circuit-formation-face 6a. The size of the device-formation-regions R1 are determined according to the size of the semiconductor chips to be manufactured and arranged in, for example, rectangular regions. Dividing regions R2, which are roughly belt-shaped regions that have a prescribed width dimension (i.e., a region that has a width dimension sufficiently smaller than that in the lengthwise direction thereof), are arranged between the mutually adjacent device-formation-regions R1. The dividing regions R2 serve as the regions that are arranged in a roughly grating-like shape on the circuit-formation-face 6a of the semiconductor wafer 6 defining the device-formation-regions R1 and also serve as the frame-shaped regions arranged outside the peripheries of the device-formation-regions R1 with regard to the relation thereof to one device-formation-region R1. Further, the dividing regions R2 are located in dividing positions where the device-formation-regions R1 are separated into individual pieces in the plasma dicing process. Moreover, the semiconductor devices 44 are formed in the respective device-formation-regions R1.

As shown in FIG. 9, the semiconductor wafer 6 is formed of a silicon substrate 45 that has a disk-like shape, and the silicon oxide film 35 formed of $SiO_2$ is formed on the entire circuit-formation-face 6a thereof. Further, the semiconductor devices 44 are formed in portions that correspond to the device-formation-regions R1 of the circuit-formation-face 6a. The semiconductor devices 44 include devices of MOS (Metal-Oxide-Semiconductor) structure transistors constructed of a silicon substrate 45 (Semiconductor), a silicon oxide 35 (Oxide) formed directly on the circuit-formation-face 6a and a metal film (Metal) formed on the silicon oxide 35. Further, the semiconductor devices 44 have connection terminals 43 (also called the bonding pads) for electrically connecting the devices to external electronic apparatuses. It is noted that a surface protection film 46 (e.g., formed of polyimide) is formed on the surfaces of the semiconductor devices 44 for the protection of the surfaces of the semiconductor devices 44. The connection terminals 43 are not covered with the surface protection film 35 but exposed outside.

The semiconductor wafer 6 where the semiconductor devices 44 are thus formed is subjected to an inspection of the formation state of the semiconductor devices 44 in order to determine whether or not defective portions exist in the formation state (semiconductor device inspection process in step S2). It is noted that the semiconductor devices 44, which are determined to be defective through the inspection, are subjected to measures such that they are not used as the semiconductor devices 44 by storing the information of the position on the semiconductor wafer 6 or similar measures.

Moreover, in order that the circuit-formation-face 6a of the semiconductor wafer 6 that has completely undergone the inspection might not suffer damages during each process subsequently carried out, the protective sheet 30 is peelably stuck to the circuit-formation-face 6a via an adhesive. With regard to the protective sheet 30, one that is shaped into the same shape as the exterior shape of the semiconductor wafer 6 is used so that the sheet covers the entire surface of the circuit-formation-face 6a and does not protrude from the end portions of the semiconductor wafer 6. By using the protective sheet 30 of the shape, the occurrence of damage that the protective sheet 30 protruding from the semiconductor wafer 6 is burnt by the plasma can be prevented in the subsequent processing such as plasma processing.

Figure 8C:
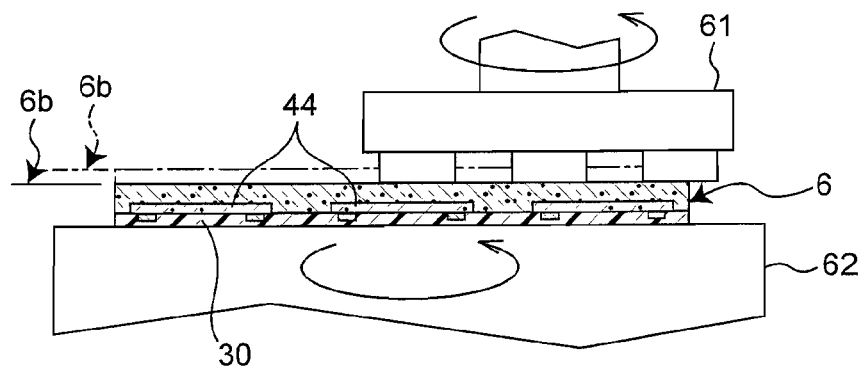

Next, an abrading process for reducing the thickness of the semiconductor wafer 6 is carried out in step S3 of FIG. 7. As shown in FIG. 8C, the semiconductor wafer 6 is placed on a retention table 62 of a grinder via a protective sheet 30 with the circuit-formation-face 6a of the semiconductor wafer 6 located on the lower side in the FIG., and the placement position is retained. In this state, the processing-target-face 6b (second surface) that is the surface located opposite from the circuit-formation-face 6a of the semiconductor wafer 6 is subjected to grinding by means of a grinding wheel 61. A grindstone for grinding is fixed to the illustrated lower surface of the grinding wheel 61, and the processing-target-face 6b is ground by rotating the grindstone while bringing the grindstone in contact with the processing-target-face 6b of the semiconductor wafer 6. Through the abrading process, the thickness of the semiconductor wafer 6 is reduced so that the thickness becomes equal to or smaller than 100 μm or, for example, 50 μm in the present first embodiment.

Figure 8D:
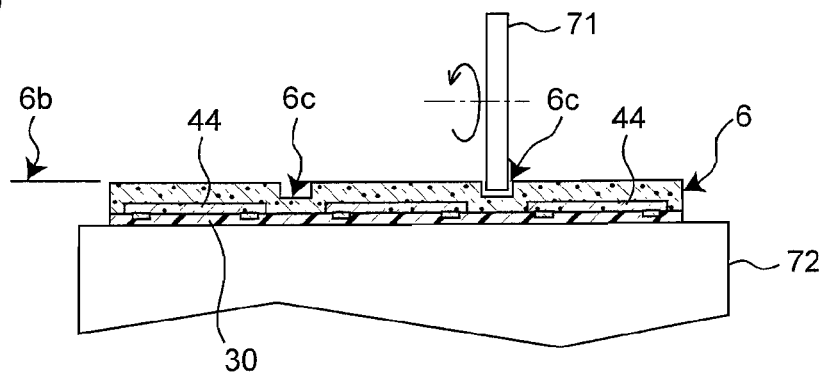

Next, dividing-groove portions 6c are formed in accordance with the separation positions of the semiconductor devices, i.e., the dividing regions R2 on the processing-target-face 6b of the semiconductor wafer 6 that has undergone the thickness reduction as described above (groove formation process (half-cut dicing) in step S4). As shown in FIG. 8D, the semiconductor wafer 6 is placed on a retention table 72 of a dicer via a protective sheet 30, the placement position is retained, and dividing-groove portions 1 c are formed by means of a disc rotary blade 71 on the processing-target-face 6b of the semiconductor wafer 6. At the semiconductor wafer 6, the semiconductor devices 44 are arranged in a matrix form, and the dividing positions, i.e., the dividing regions R2 are defined so that the semiconductor devices 44, i.e., the device-formation-regions R1 can be individually separated. By bringing the disc rotary blade 71 in contact with the processing-target-face 6b of the semiconductor wafer 6 while rotationally driving the blade and linearly moving the blade along the dividing positions, grating-shaped dividing-groove portions 6c can be formed along the dividing positions. It is noted that the so-called dicer can be used as the disc rotary blade 71.

Figure 10:
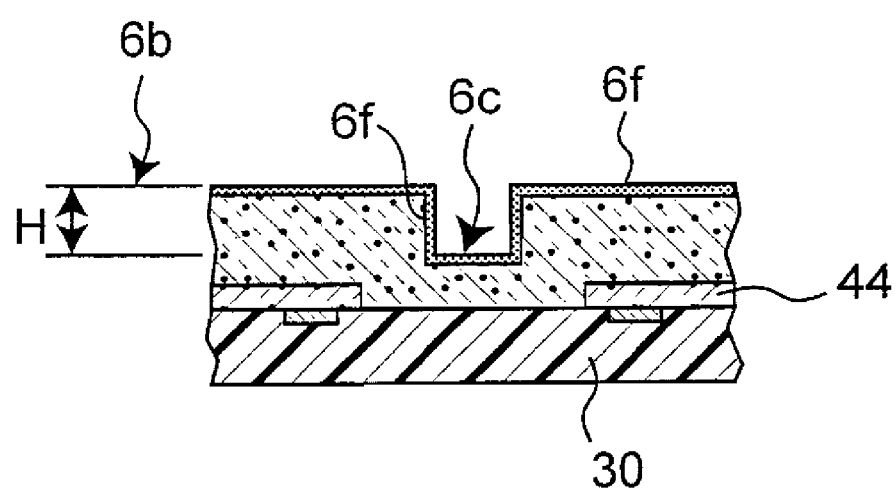
FIG. 10 is a partially enlarged schematic sectional view of the dividing-groove portions formed on the semiconductor wafer.

In this case, an enlarged cross-sectional view of the thus-formed dividing-groove portions 6c is shown in FIG. 10. As shown in FIG. 10, a depth dimension H is determined so that the bottom surface of the dividing-groove portions 6c does not reach the circuit-formation-face 6a (i.e., half-cut is achieved). The formation described above prevents the semiconductor devices 44 from being separated into individual pieces due to the formation of the dividing-groove portions 6c. In this case, the "dividing-groove portions" are the recess portions formed on the processing-target-face 6b of the semiconductor wafer 6, and the bottom surface thereof does not reach the circuit-formation-face 6a. That is, one such that the bottom surface of the recess portions reaches (i.e., penetrates) the circuit-formation-face 6a is not referred to as the dividing-groove portions 6c in the present specification.

Moreover, the depth dimension H of the dividing-groove portions 6c is determined to be not smaller than the thickness dimension of the semiconductor chips that are finally formed. In the present first embodiment, the depth dimensions H of the dividing-groove portions 6c is set to 25 μm with respect to the thickness dimension of 50 μm of the semiconductor wafer 6 reduced in thickness, and the thickness dimension of the semiconductor chips that are finally formed is 25 μm. Moreover, a distance dimension between the bottom surface of the dividing-groove portions 6c and the circuit-formation-face 6a can be determined within a range of, for example, 5 to 25 μm in consideration of a minimum distance dimension with which the configuration of the dividing-groove portions 6c can be kept. Moreover, by carrying out mechanical processing like the abrading process (step S3) and the groove formation process (step S4), a damaged layer 6f where the applied stress remains is to be formed in the neighborhoods of the processing-target-face 6b and the inner surfaces of the dividing-groove portions 6c of the semiconductor wafer 6 as shown in FIG. 10.

Next, plasma etching is performed on the semiconductor wafer 6 where the dividing-groove portions 6c are formed as described above (plasma etching process in step S5). In the present invention, the plasma etching is performed without forming a mask layer (or a resist layer) on the surface of the semiconductor wafer 6.

Figure 11:
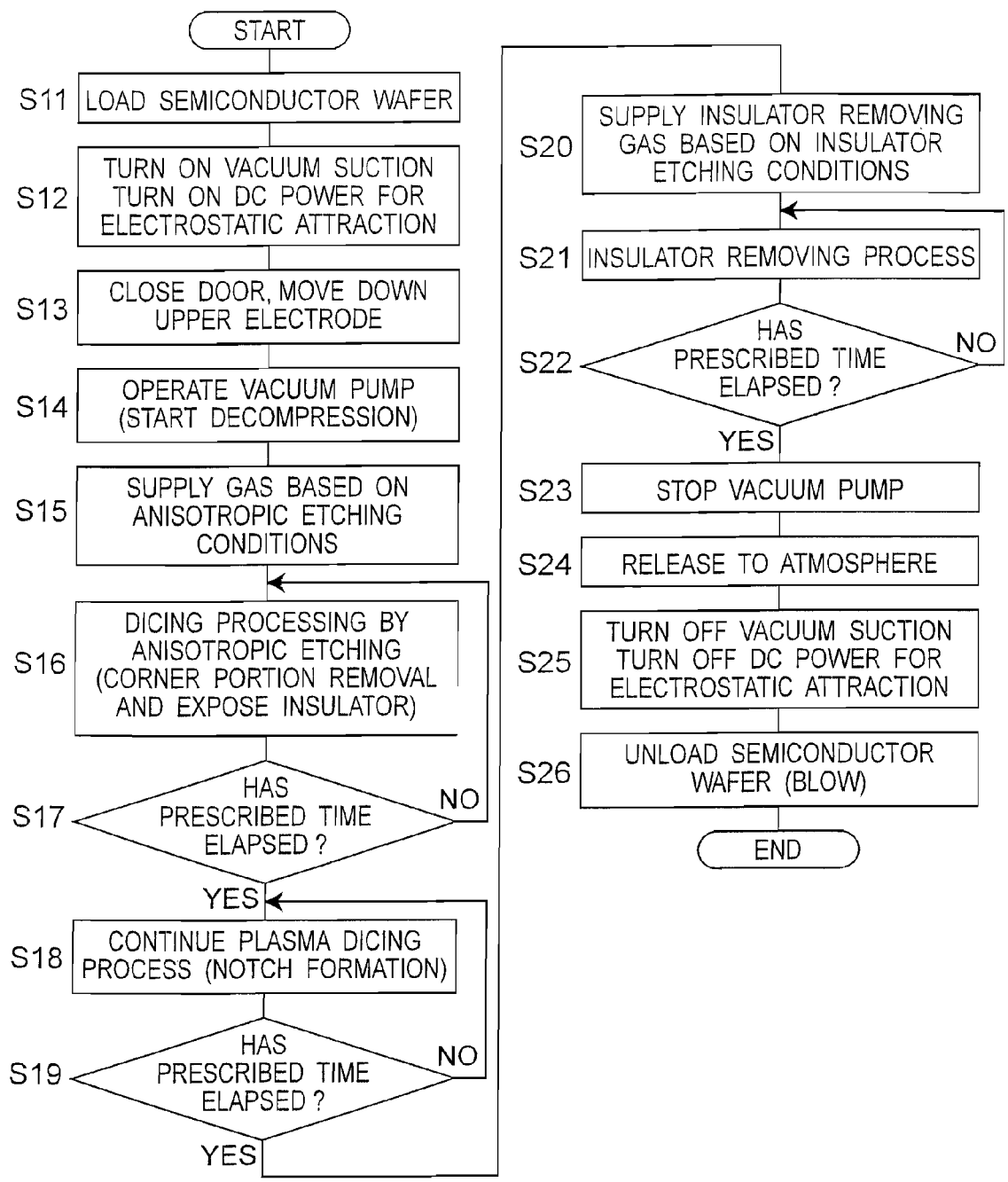
FIG. 11 is a flow chart showing the procedure of the semiconductor wafer dividing method (plasma dicing) of the first embodiment.

In this case, a flow chart showing a detailed procedure carried out in the plasma etching process in step S5 is shown in FIG. 11, and schematic explanatory views for explaining the procedure are shown in FIGS. 12A and 12B, FIGS. 13A and 13B and FIGS. 14A and 14B. A description is provided below referring mainly to the FIGS.

It is noted that the control of each subsequent operation in the plasma processing apparatus 101 is executed by controlling the components by the process control section 91 on the basis of the operation program 82 stored in the storage section 92 of the control unit 33.

First of all, in step S11 of the flow chart of FIG. 11, the semiconductor wafer 6 where the dividing-groove portions 6c are formed is loaded into the processing chamber 2 as shown in FIG. 16. During this loading operation, the semiconductor wafer 6 retained to a suction head 27 via a mask is loaded from the opening 1b into the processing chamber 2 by operating an arm 27a in a state in which the upper electrode 4 is moved up by an electrode elevation unit 24, and the semiconductor wafer 6 is placed on the lower electrode 3 via a protective sheet 30.

Next, the vacuum suction pump 12 is driven to effect vacuum suction through the attraction holes 3e to turn on the vacuum attraction of the semiconductor wafer 6, and the DC power unit 18 for electrostatic attraction is turned on (step S12). By the vacuum attraction, the semiconductor wafer 6 is held by the lower electrode 3 in a state in which the protective sheet 30 closely adhere to the retention surface 3g of the lower electrode 3 in the processing chamber 2.

Figure 17:
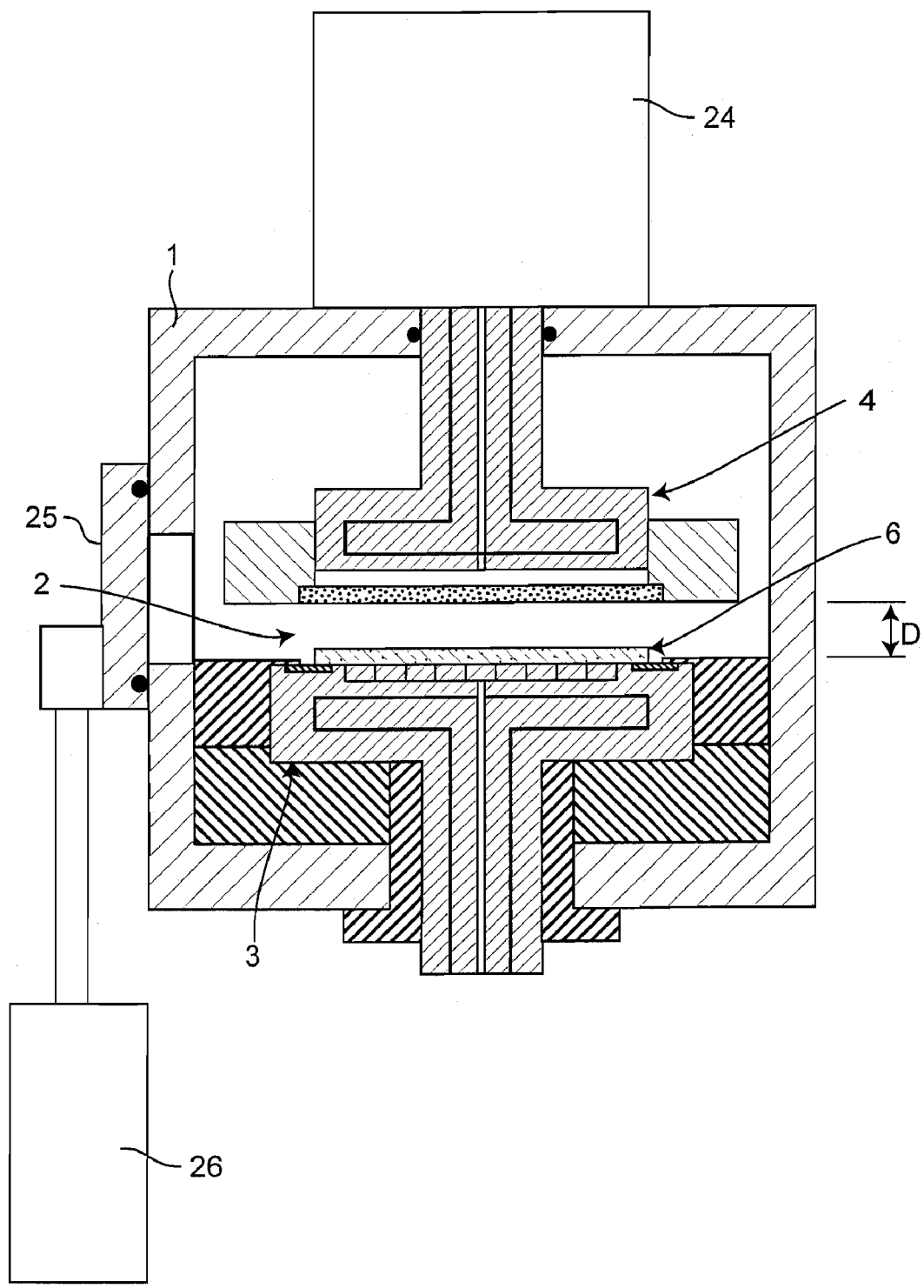
FIG. 17 is a schematic sectional view of the plasma processing apparatus in a state in which a plasma etching process is carried out.

Subsequently, the door 25 is closed as shown in FIG. 17, and the upper electrode 4 is moved down by the electrode elevation unit 24 (step S13). At this time, the plasma processing conditions 81A for the anisotropic etching is selected and taken out of the plasma processing conditions 81 stored in the storage section 92 of the control unit 33 by the process control section 91 on the basis of the operation program 82, and the interelectrode distance D between the upper electrode 4 and the lower electrode 3 is set to a prescribed condition within a range of, for example, 5 to 50 mm based on the condition of the interelectrode distance D included in the plasma processing conditions 81A for the anisotropic etching.

Next, the vacuum pump 8 is operated to start decompression in the processing chamber 2 (step S14). When the inside of the processing chamber 2 reaches a prescribed degree of vacuum, the gasses selected by the gas flow rate regulating section 21 are regulated to a prescribed gas composition and a prescribed flow rate based on the selected plasma processing conditions 81A for the anisotropic etching and supplied into the processing chamber 2 (step S15). In concrete, the first on/off valve 22A is opened on the basis of the plasma processing conditions 81A for the anisotropic etching, and $SF_6$ is supplied from the first gas supply unit 20A to the gas mixing portion 19 with the supply flow rate thereof regulated by the first flow rate control valve 23A. In addition, the second on/off valve portion 22B is opened, and $O_2$ is supplied from the second gas supply unit 20B to the gas mixing portion 19 with the supply flow rate thereof regulated by the second flow rate control valve 23B. At this time, the third on/off valve 22C is put in a closed state, and $CHF_3$ is not supplied. Moreover, $SF_6$ and $O_2$ are mixed together so as to have a gas composition of 10:2 at the gas mixing portion 19 and supplied into the processing chamber 2.

Then, in the gas supply process, the internal pressure of the processing chamber 2 is detected by the pressure sensor 28 and compared with the pressure condition (e.g., 100 Pa) in the plasma processing conditions 81A, and it is confirmed that the detected pressure has reached the pressure expressed by the pressure condition. That is, the interelectrode distance D between the lower electrode 3 and the upper electrode 4, the composition of the gases to be supplied to the processing chamber 2 and the internal pressure of the processing chamber 2 are set on the basis of the plasma processing conditions 81A for the anisotropic etching.

Then, after the condition setting is completed, a high-frequency voltage that agrees with the condition is applied between the upper electrode 4 and the lower electrode 3 by driving the high-frequency power unit 18 on the basis of the frequency (e.g., 60 MHz) and the output condition of the high frequency of the plasma processing conditions 81A, and plasma discharge is started (step S16). As a result, the supplied mixed gas makes a transition to the plasma state in the discharge space between the upper electrode 4 and the lower electrode 3. By the plasma generation, ions in the plasma are applied to the semiconductor wafer 6 from the processing-target-face 6b. By the application of ions, silicon (i.e., silicon substrate 45) that is the principal material of the semiconductor wafer 6 is etched.

Figure 3A:
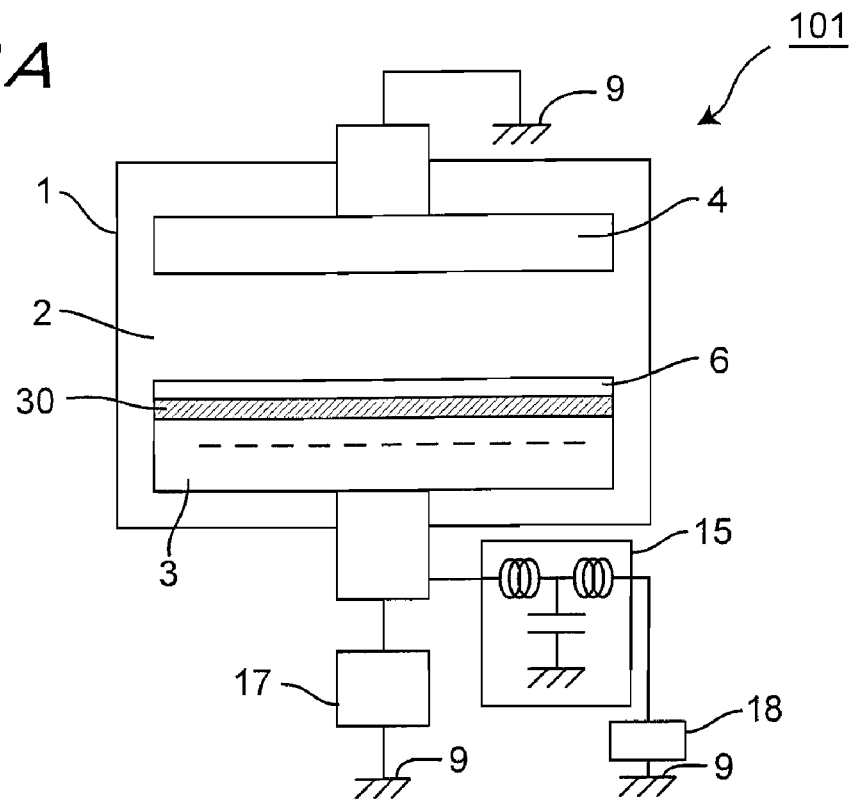
FIGS. 3A and 3B are schematic structural views of the plasma processing apparatus of FIG. 1, where.
Figure 3B:
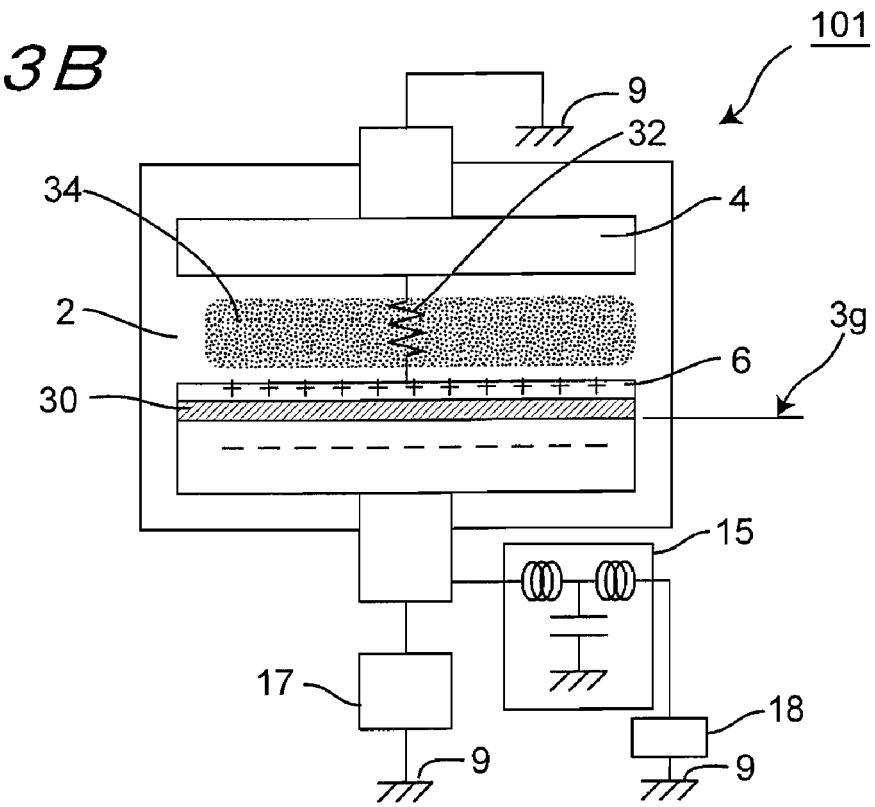

Concurrently with this, a direct current application circuit 32 is formed in the discharge space between the upper electrode 4 and the lower electrode 3 by the plasma (see FIGS. 3A and 3B). As a result, an electrostatic attraction force is generated between the lower electrode 3 and the semiconductor wafer 6, and the semiconductor wafer 6 is held by the lower electrode 3 with the electrostatic attraction force. Therefore, the protective sheet 30 satisfactorily adheres close to the retention surface 3g of the lower electrode 3, and the semiconductor wafer 6 is stably retained in the plasma processing process. In addition, the protective sheet 30 is satisfactorily cooled by the cooling function provided for the lower electrode 3, and damage due to heat generated by the plasma discharge is prevented.

Moreover, plasma etching by anisotropic etching is performed on the entire processing-target-face 6b of the semiconductor wafer 6 in the plasma dicing process (second corner portion removal process and insulator exposure process), by which the processing-target-face 6b of the semiconductor wafer 6 and the inner surfaces of the dividing-groove portions 6c are etched. By performing the etching as described above, as shown in FIG. 12B, the dividing-groove portions 6c are removed, and the device-formation-regions R1 of the semiconductor wafer 6 are individually divided excluding the silicon oxide film 35. In this case, the fact that "the dividing-groove portions 6c are removed" means that the bottom surface of the dividing-groove portions 6c is brought close to the circuit-formation-face 6a by performing etching on the bottom surface and finally the bottom surface is made to coincide with the circuit-formation-face 6a, by which penetration from the processing-target-face 6b to the circuit-formation-face 6a is achieved along the dividing regions R2 at the semiconductor wafer 6, excluding the silicon oxide film 35.

Moreover, since the plasma etching is performed by the anisotropic etching on the basis of the plasma etching conditions 81A, the etching characteristic is increased in the direction of thickness of the semiconductor wafer 6, so that the etching of the bottom surface of the dividing-groove portions 6c can efficiently be performed.

Moreover, in step S17, the plasma dicing process (insulator exposure process) in step S16 is carried out until the etching bottom portion that is the bottom portion of the dividing-groove portions 6c is removed by etching and the surface of the silicon oxide film 35 is exposed from the bottom portion (i.e., until the surface of the insulating film is exposed), or, for example, until the time measured by the processing time measurement section 95 reaches the condition of the processing time necessary for exposing the silicon oxide film 35 included in the plasma processing conditions 81A. By thus providing a state in which the silicon oxide film 35 is exposed at the dividing-groove portions 6c, i.e., the dividing-groove portions 6c themselves are removed, the portions that correspond to the dividing regions R2 are removed from the silicon substrate 45, excluding the silicon oxide film 35.

Figure 12A:
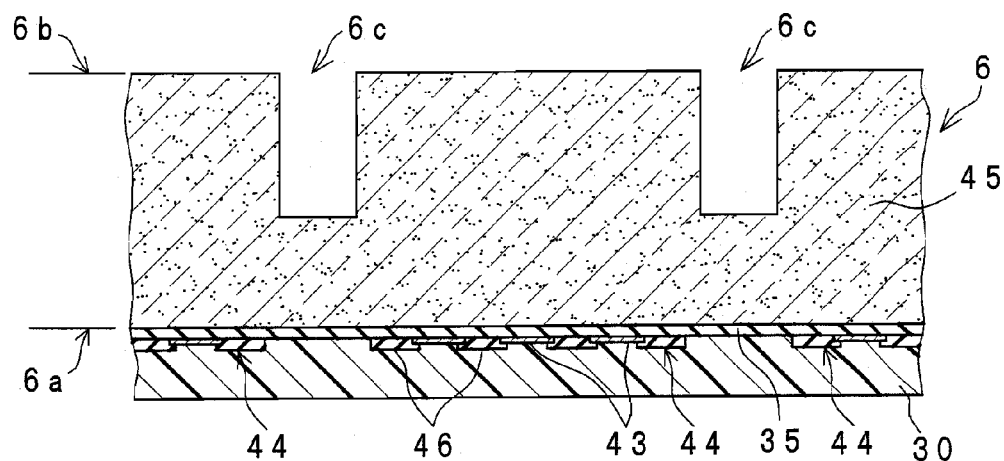
FIGS. 12A and 12B are schematic explanatory views of the semiconductor wafer showing the processes of the semiconductor chip manufacturing method of the first embodiment, where.
Figure 12B:
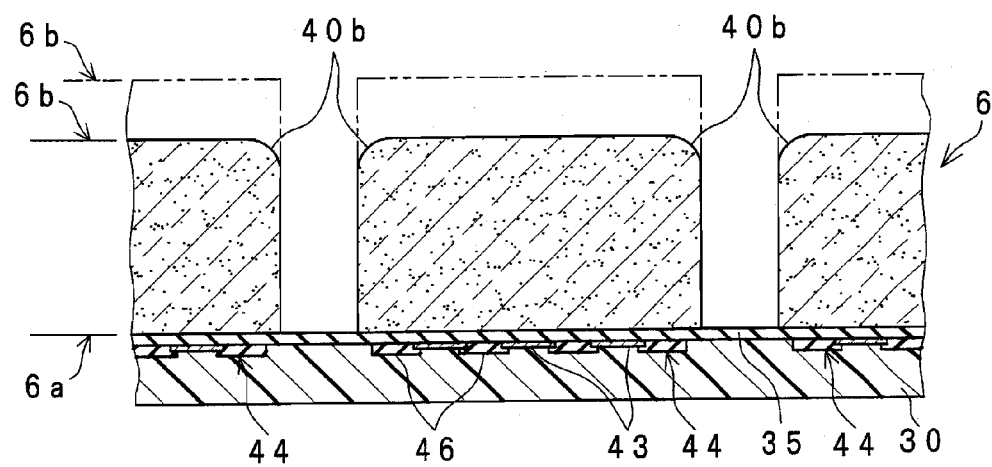

Moreover, by performing the plasma etching, the inner surfaces of the dividing-groove portions 6c are etched together with the processing-target-face 6b as shown in FIG. 12B. However, since no mask layer is placed on the processing-target-face 6b as in the conventional plasma etching, the corner portions (edge portions) at the entrance end portions of the dividing-groove portions 6c are similarly etched. Consequently, the corner portions are removed, and the corner portions and the ridgelines of the processing-target-face 6b in the device-formation-regions R1 are removed, so that rounded (R) portions 40b of one example of the curved convex surface portions are formed in the positions of the removal (i.e., removal of corner portions on the second surface side, or second corner portion removal process). Although the etching is performed principally in the direction of thickness of the semiconductor wafer 6 by the plasma etching of the dividing-groove portions 6c, etching is slightly effected in the direction along the surface of the semiconductor wafer 6 due to the etching characteristic. The etching characteristic contributes to the formation of the rounded portions 40b, and it is desirable to preliminarily determine the width dimension of the dividing-groove portions 6c in consideration of the fact that the width dimension of the dividing-groove portions 6c is expanded by the etching.

Moreover, by performing plasma etching on the processing-target-face 6b and the inner surfaces of the dividing-groove portions 6c of the semiconductor wafer 6, the damaged layer 6f generated by the mechanical processing can be removed.

Figure 13A:
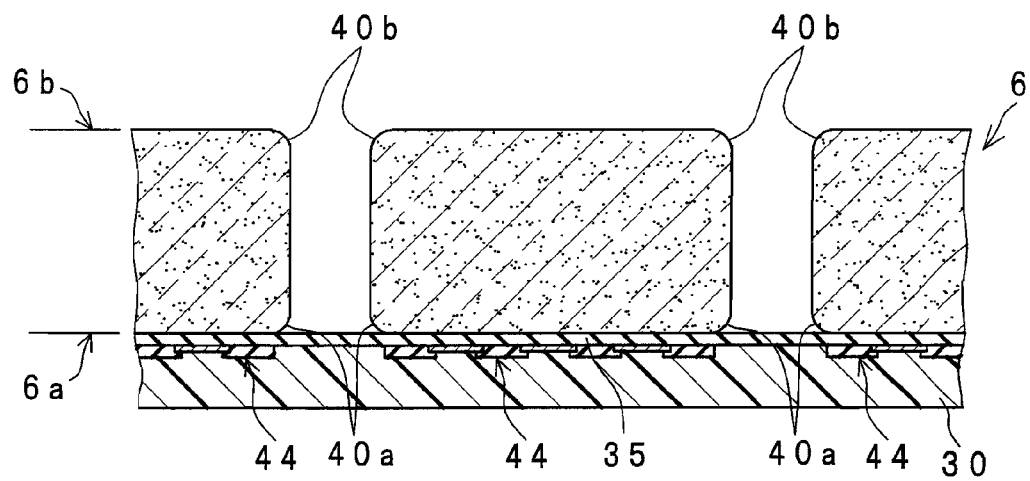
FIGS. 13A and 13B are schematic explanatory views of the semiconductor wafer showing the processes of the semiconductor chip manufacturing method continued from FIG. 12B, where.

When it is determined in step S17 that it reaches the prescribed time, the plasma dicing process under the same condition is continuously carried out by anisotropic etching in step S18 as a plasma dicing process for performing the notch formation (i.e., notch formation process or first corner portion removal process). As a result, the exposed silicon oxide film 35 becomes electrically charged with the positive charge of the ions applied from inside the plasma to the bottom portions of the removed dividing regions R2, and the trajectory of the next incident ions into the dividing regions R2 are consequently bent, performing the etching of the divided silicon substrate 45 so that the bottom portions are expanded in the widthwise direction. Consequently, as shown in FIG. 13A, notches 42 are formed at both corner portions of the bottom portions of the dividing regions R2, i.e., the corner portions of the portions put in contact with the silicon oxide film 35 of each piece of the divided silicon substrate 45 are removed, forming rounded (R) portions 40a.

The plasma dicing process for notch formation in step S18 is carried out in step S19 until the notches 42 and the rounded portions 40a of the prescribed sizes are formed, e.g., the time measured by the processing time measurement section 95 reaches the condition of the processing time necessary for forming the notches of the prescribed size included in the plasma processing conditions 81A.

If it is determined that it has reached the processing time in step S19, then the plasma dicing process (notch formation process) by the anisotropic etching is ended, and the plasma processing conditions 81B for the insulating film removing process are selected by the process control section 91, and the gases selected by the gas flow rate regulating section 21 are regulated to a prescribed gas composition and a prescribed flow rate based on the conditions and supplied into the processing chamber 2 (step S20). In concrete, the third on/off valve 22C is opened on the basis of the plasma processing conditions 81B for the insulating film removing process, so that $CHF_3$ is supplied from the third gas supply unit 20C to the gas mixing portion 19 with its supply flow rate regulated by the third flow rate control valve 23C.

Then, it is confirmed that the internal pressure of the processing chamber 2 detected by the pressure sensor 28 has reached a pressure condition (e.g., 50 Pa) in the plasma processing conditions 81B in the gas supply process. It is noted that the interelectrode distance D between the lower electrode 3 and the upper electrode 4 is kept as it is.

Subsequently, on the basis of the frequency (e.g., 13.56 MHz) and the output condition of the plasma processing conditions 81B, by starting plasma discharge by applying a high-frequency voltage that agrees with the conditions between the upper electrode 4 and the lower electrode 3 by driving the high-frequency power unit 18, the plasma etching for removing the silicon oxide 35 exposed in the dividing regions R2 is started (insulator removal process in step S21).

Figure 13B:
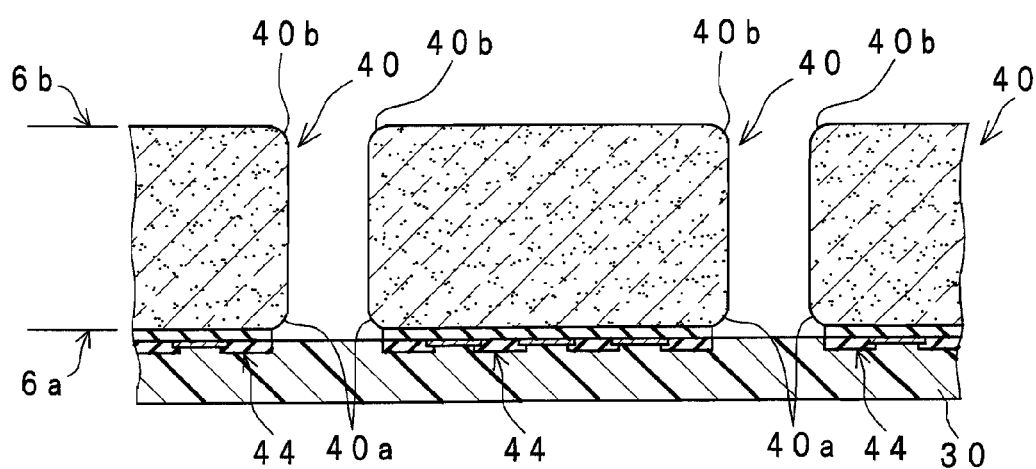

By carrying out the plasma etching as described above, the silicon oxide 35 that has been exposed, i.e., the silicon oxide 35 located in the portions that correspond to the dividing regions R2 are positively etched as shown in FIG. 13B, so that the silicon oxide 35 in the portions is removed. Consequently, the portions that correspond to the dividing regions R2 are completely removed from the semiconductor wafer 6, and the device-formation-regions R1 are separated into individual pieces, forming the semiconductor chips 40 that include the respective semiconductor devices 44. It is noted that the plasma etching is carried out until the time measured by the processing time measurement section 95 reaches the processing time included in the plasma processing conditions 81B (step S22).

If it is determined in step S22 that it has reached the prescribed time, then the plasma etching process for the insulating film removing process, i.e., the insulator removal process is ended. When the processing is ended, the supply of the mixed gas and the application of the high-frequency voltage are stopped.

Subsequently, the operation of the vacuum pump 8 is stopped (step S23), and the exhaust switchover valve 7 is switched for release to the atmosphere (step S24). As a result, the internal pressure of the processing chamber 2 is restored into the atmospheric pressure. Then, the vacuum attraction is turned off, and the DC power unit for electrostatic attraction is turned off (step S25). As a result, the retention by attraction of the semiconductor wafer 6 in a state in which it is divided into individual pieces of the semiconductor chips 40 and retained by the protection tape 30 is released.

Yet subsequently, the semiconductor wafer 6 that has undergone the plasma processing is unloaded (step S26). That is, the semiconductor wafer 6 is sucked and held by the suction head 27 and unloaded to the outside of the processing chamber 2 with the $N_2$ gas blown through the attraction holes 3e. As a result, the plasma etching process for continuously carrying out the second corner portion removal process, the insulator exposure process, the notch formation process (first corner portion removal process) and the insulator removal process is ended in the plasma processing apparatus 101.

Figure 14A:
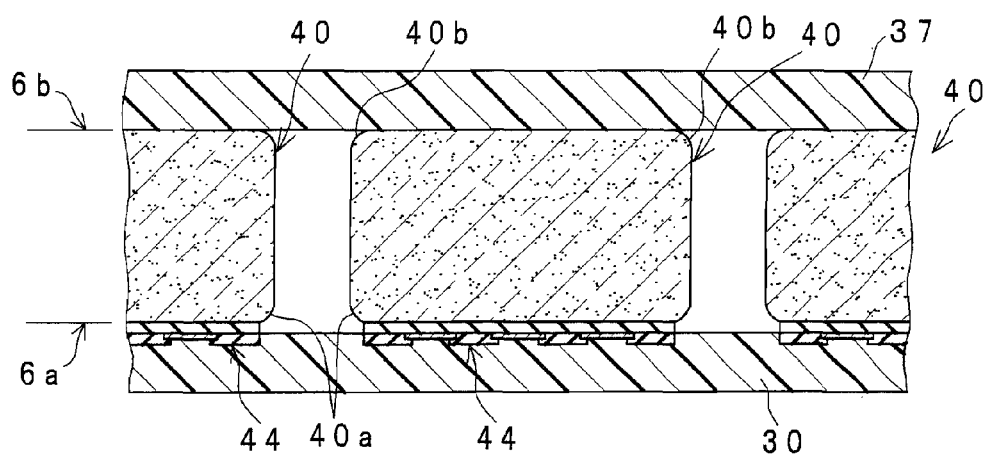
FIG. 14A and FIG. 14B are schematic explanatory views of the semiconductor wafer showing the processes of the semiconductor chip manufacturing method continued from FIG. 13B, where.
Figure 14B:
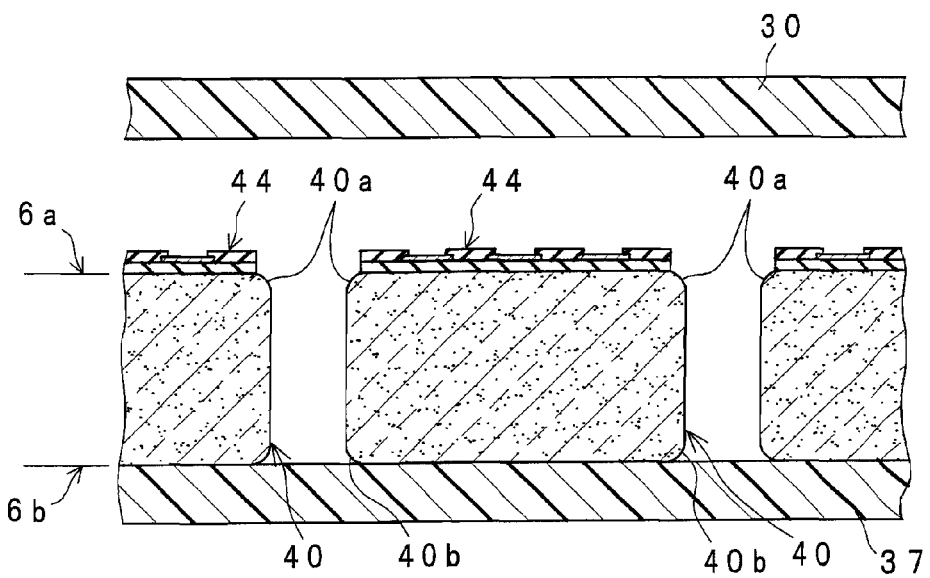

Then, the semiconductor wafer 6 unloaded together with the protective sheet 30 is transferred to a sheet peeling process (die-bonding sheet sticking process in step S6), where the protective sheet 30 is peeled off from the circuit-formation-faces 6a of the semiconductor chips 40. As shown in FIGS. 14A and 14B, the sheet peeling is performed after the die-bonding sheet 37 that is the adhesive sheet for retention use is stuck to the processing-target-face 6b of the semiconductor chips 40 and the semiconductor chips 40 are retained on the die-bonding sheet 37. As a result, the manufacturing processes of the semiconductor chips are completed.

In this case, FIG. 31 shows a schematic perspective view (including a partial removal cross section) showing the appearance of the thus-formed semiconductor chips 40. As shown in FIG. 31, the rounded portions 40a that are curved convex surface portions can be formed so as to remove (i.e., remove through the first corner portion removal process) the sharp corner portions (or ridgelines) at the end portions (i.e., at the end portions in all of the four directions) on the circuit-formation-face 6a side of the semiconductor chips 40. Further, the rounded portions 40b that are curved convex surface portions can be formed so as to remove (i.e., remove through the second corner portion removal process) the sharp corner portions (or ridgelines) at the end portions (i.e., at the end portions in all of the four directions) on the processing-target-face 6b of the semiconductor chips 40. That is, all the corner portions and the ridgelines of the semiconductor chips 40 can be removed. As a result, the chipping due to the corner portions and the like that become chipped can be suppressed from occurring on the manufactured semiconductor chip 40, and the transverse rupture strength can be improved.

Moreover, the thus-formed semiconductor chip 40 is, for example, a semiconductor chip of a reduced thickness such that the thickness dimension thereof is sufficiently smaller than the width dimension thereof. Concretely describing the structure of the semiconductor chip 40, the semiconductor chip 40 has a first surface (circuit-formation-face) 40c which has a roughly rectangular flat surface and on which the semiconductor device 44 is formed, a second surface 40d which is a roughly rectangular flat surface parallel to the first surface 40c located on the side opposite from the first surface 40c, and a connection surface 40e which is located at the periphery of the first surface 40c and the second surface 40d and connects the end portion of the first surface 40c with the end portion of the second surface 40d. Furthermore, the semiconductor chip 40 is constructed so that the connection surface 40e includes the respective rounded portions 40a and 40b that are curved convex surface portions so that no ridgelines are formed at the end portions of the first surface 40c and the second surface 40d. Therefore, in the manufactured semiconductor wafer 40, the portions where the ridgelines have been located by the conventional manufacturing method can be constructed of curved convex surface portions, and the transverse rupture strength can be improved. Considering the fact that the thickness dimension is sufficiently smaller than the width dimension in the semiconductor chip 40 as described above, it is also possible to form all the connection surfaces 40e of the curved convex surface portions.

Moreover, the plasma etching is performed in the state in which the dividing-groove portions 6c are formed instead of the case where the mask layer is placed on the processing-target-face 6b of the semiconductor wafer 6 as in the conventional case, and therefore, the rounded portions can be formed at the four corner portions of the device-formation-regions R1. The configuration of the formed semiconductor chip 40 can be formed into a smoother configuration, and this is preferable. In the thus-formed semiconductor chips 40, the width dimension of the dividing regions R2 is, for example, about 5 to 20 μm, the width dimension of the removed corner portions, i.e., the diameter dimension of the rounded portions 40a and 40b is about 0.5 to 20 μm, and further the width dimension of the removed silicon oxide film 35 is not greater than about 50 μm. Although the curved convex surface portions come to have a configuration that unlimitedly resembles chamfered portions (inclined flat surface portions or tapered portions) if the radius of curvature of the "rounded portions", or the "curved convex surface portions" becomes unlimitedly small, such chamfered portions are included in the curved convex surface portions of the present embodiment so long as the portions are convex surface portions curved even a little.

Although the case where the rounded portions 40a are formed by forming notches at the corner portions of the semiconductor chip 40 has been described above, the manufacturing method for semiconductor chips of the present first embodiment is not limited only to this case, and it may be a case where chamfer portions obtained by removing the sharp portions are formed at the corner portions. This is because the occurrence of chipping can be suppressed even if the chamfer portions are formed as described above.

Moreover, although the case where the principal portion of the semiconductor wafer 6 is the silicon substrate 45 formed of silicon has been described above, the notch formation of the present first embodiment can be similarly carried out and a similar effect can be obtained even when the semiconductor wafer is formed of a GaAs based material in place of the above case. It is noted that a gas constituted mainly of chlorine based gas should preferably be used as the plasma processing gas in place of the fluorine based gas ($SF_6$, $CF_4$) for etching the silicon material. Even when the GaAs based material is used as described above, the silicon oxide can be used as the insulating film.

According to the first embodiment, various effects can be obtained as follows.

By using the semiconductor wafer, on which the silicon oxide film 35 is placed as the insulating film in the portions that correspond to the dividing regions R2 of the circuit-formation-face 6a as the semiconductor wafer 6 and carrying out the plasma dicing process from the processing-target-face 6b, the semiconductor chip manufacturing method capable of forming the rounded portions 40a at the corner portions of the formed semiconductor chips 40 and improving the transverse rupture strength can be provided.

In concrete, by carrying out the plasma etching on the entire processing-target-face 6b that includes the inner surfaces of the dividing-groove portions 6c on the semiconductor wafer 6 where the dividing-groove portions 6c are formed in accordance with the dividing regions R2, the silicon oxide film 35 is exposed from the etching bottom portions by removing the dividing-groove portions 6c themselves with the progress of the etching. Concurrently with it, the rounded portions 40b can be formed by additionally etching the corner portions that have been formed at the entrance end portions of the dividing-groove portions 6c for the removal of the corner portions. Subsequently, by continuing the plasma dicing process in the state in which the silicon oxide film 35 is exposed, the exposed silicon oxide 35 can be charged with the positive charge due to the ions in the plasma, and the rounded portions 40a can be formed by removing the corner portions of the semiconductor chips 40 put in contact with the silicon oxide film 35 by bending the trajectory of the applied ions by the charging.

By thus forming the rounded portions 40a on the circuit-formation-face 6a and forming the rounded portions 40b on the processing-target-face 6b at the semiconductor chips 40, the semiconductor chips, which are able to suppress the occurrence of chipping of the manufactured semiconductor chips 40 and of which the transverse rupture strength is improved, can be manufactured.

Therefore, all the ridgelines can be removed from the semiconductor chips 40 separated by the plasma dicing process, so that the smooth curved convex surface portions can be formed at the portions where the ridgelines and corner portions have originally been located, and the transverse rupture strength can be improved.

Moreover, with regard to the exposed silicon oxide film 35, the silicon oxide film 35 can be positively etched by performing the plasma etching by switching, for example, the kind of the gas, and the removal can reliably be achieved. Therefore, the silicon oxide film 35, which is not formed in the portions that correspond to the dividing regions R2 in the conventional semiconductor wafer 501 to be subjected to the plasma dicing process, can be removed by carrying out the plasma etching process by switching the kind of the gas in the case where the silicon oxide film 35 is formed in the portions that correspond to the dividing regions R2, and the semiconductor wafer 6 can reliably be divided into the individual pieces of the semiconductor chips 40.

Moreover, by performing plasma etching in the state in which no mask layer is placed on the processing-target-face 6b at the semiconductor chips 40, the damaged layer 6f generated on the processing-target-face 6b due to, for example, the formation of the dividing-groove portions 6c or the like can be removed by the etching, and the manufacturing steps of the semiconductor chips can be made efficient.

Second Embodiment

The present invention is not limited to the above embodiment but allowed to be put into practice in various modes. For example, a manufacturing method for semiconductor chips according to the second embodiment of the present invention is described below with reference to the schematic explanatory views shown in FIG. 18, FIGS. 19A and 19B, FIGS. 20A and 20B and FIGS. 21A and 21B.

The manufacturing method for semiconductor chips of the present second embodiment differs from the first embodiment in the point that a polyimide (PI) film is used as the insulating film instead of using the silicon oxide film 35 as the insulating film formed in the portions that correspond to the dividing regions R2 as in the semiconductor wafer 6 of the first embodiment. Only the different point is described below. The fact that the plasma processing apparatus 101 used in the first embodiment is similarly used by the manufacturing method for semiconductor chips of the present second embodiment is same, and therefore, no description is provided for the apparatus. Moreover, since the flow chart showing the procedure of the manufacturing method for the semiconductor chips of the present second embodiment is similar to the flow chart used for the first embodiment, no description is provided therefor.

Figure 18:
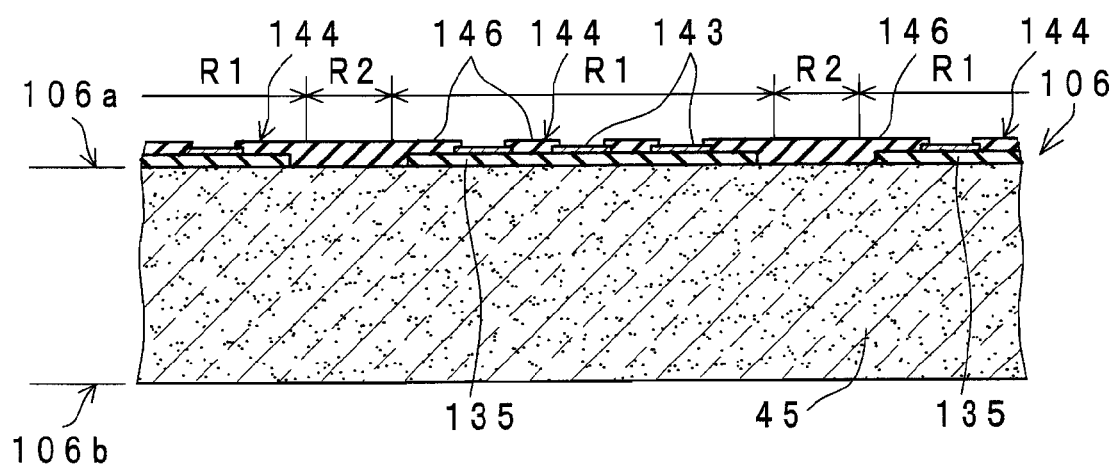
FIG. 18 is a partially enlarged schematic sectional view of a semiconductor wafer according to a second embodiment of the present invention.

First of all, as shown in FIG. 18, semiconductor devices 144 are formed in portions that correspond to the respective device-formation-regions R1 on a circuit-formation-face 106a of a semiconductor wafer 106. Each of the semiconductor devices 144 includes devices such as a MOS (Metal- Oxide-Semiconductor) structure transistor constructed of a silicon substrate 45 (Semiconductor), a silicon oxide 135 (Oxide) formed directly on the circuit-formation-face 106a and a metal film (Metal) formed on the silicon oxide 135. Further, the semiconductor devices 144 further includes a connection terminal 143 (also called the bonding pad) for electrically connecting the devices to external electronic apparatuses. In the portions that correspond to the dividing regions R2, the silicon oxide 135 is not formed unlike the first embodiment.

Moreover, as shown in FIG. 18, on the circuit-formation-face 106a of the semiconductor wafer 106, a polyimide film 146 is formed as a surface protection film covering the formed semiconductor devices 144. The polyimide film 146 has a function to protect the semiconductor devices 144 formed on the circuit-formation-face 106a and placed formed also covering the portions that correspond to the dividing regions R2 on the circuit-formation-face 106a. In the semiconductor devices 144, the surfaces of the connection terminals 143 are not entirely covered with the polyimide film 146 but exposed for electrical connection. Moreover, the main body of the semiconductor wafer 106 is similar to that of the first embodiment in the point that it is formed of the silicon substrate 45.

Figure 19A:
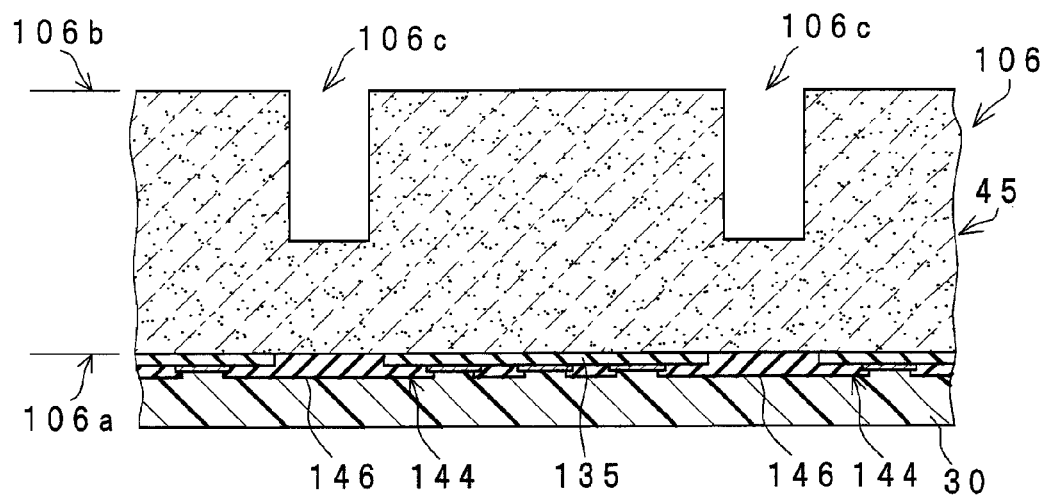
FIGS. 19A and 19B are schematic explanatory views of a semiconductor wafer showing the processes of the semiconductor chip manufacturing method of the second embodiment, where.

A protective sheet 30 is adhesively stuck to the semiconductor wafer 106 so as to protect the entire circuit-formation-face 106a. Subsequently, thickness reduction is performed by carrying out an abrading process, and dividing-groove portions 106c are formed in portions that correspond to the dividing regions R2 by carrying out a groove formation process. As a result, a semiconductor wafer 106 where the dividing-groove portions 106c are formed on a processing-target-face 106b is formed as shown in FIG. 19A.

Next, the semiconductor wafer 106 where the dividing-groove portions 106c are thus formed is subjected to plasma processing by means of the plasma processing apparatus 101.

Figure 19B:
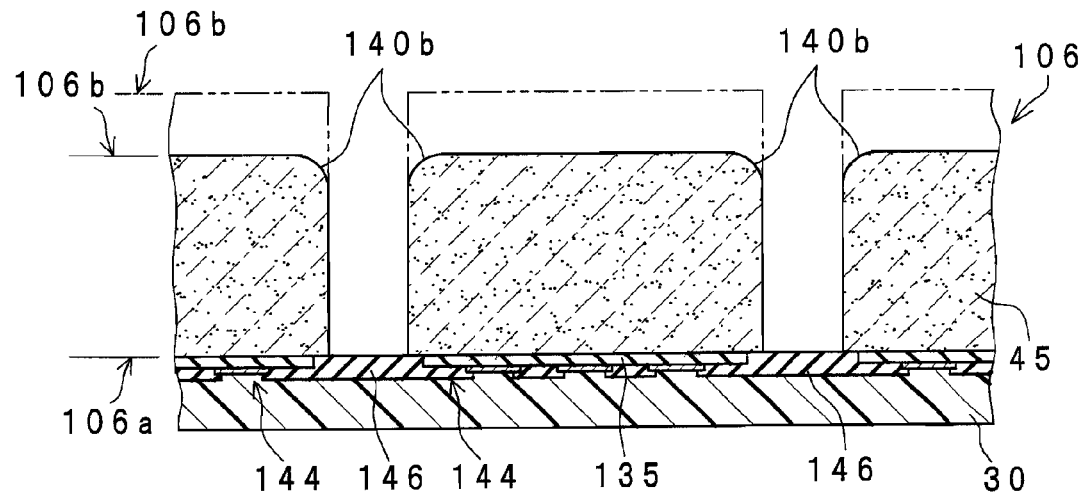

In concrete, a plasma dicing process is first carried out by anisotropic etching from the processing-target-face 106b of the semiconductor wafer 106, removing by etching the dividing-groove portions 106c formed in the portions that correspond to the dividing regions R2. As a result, as shown in FIG. 19B, the silicon substrate 45 in the portions that correspond to the dividing regions R2 is removed, so that the polyimide film 146 becomes exposed from the etching bottom portion (insulator exposure process in step S16 of FIG. 11). Moreover, concurrently with it, the corner portions at the entrance end portions of the dividing-groove portions 106c are removed by etching, so that rounded portions 140b are formed (second corner portion removal process).

Figure 20A:
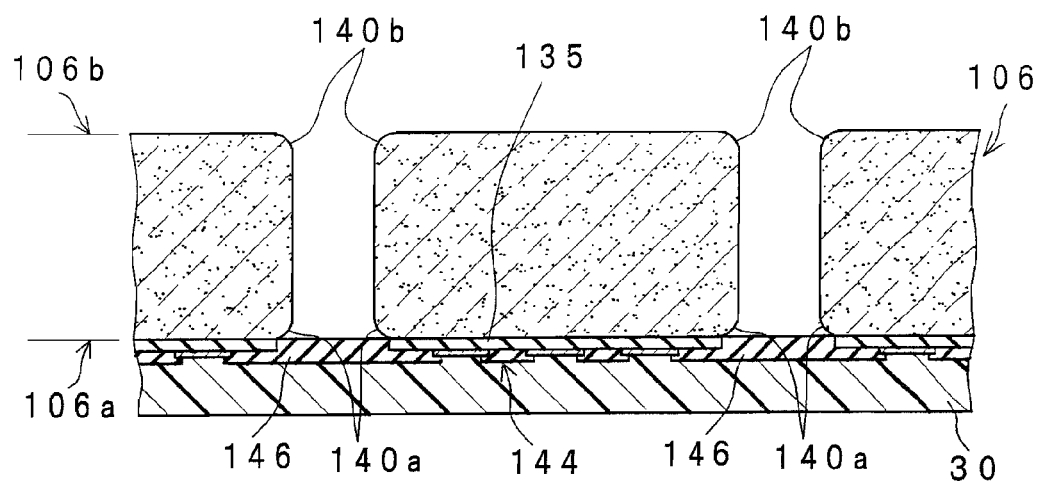
FIGS. 20A and 20B are schematic explanatory views of the semiconductor wafer showing the processes of the semiconductor chip manufacturing method continued from FIG. 19B, where.

When the polyimide film 146 that is the insulating film is exposed as described above, the exposed polyimide film 146 is charged with the positive charge of the ions in the plasma, and the trajectory of the applied ions is to be bent. Consequently, as shown in FIG. 20A, notches 142 are formed at the corner portions of the dividing regions R2, and rounded portions 140a are formed at the corner portions put in contact with the polyimide film 146 at the separated silicon substrate 45 (notch formation process in step S18 of FIG. 11). When the rounded portions 140a of the prescribed size are formed, the plasma dicing process by the anisotropic etching is ended.

Figure 20B:
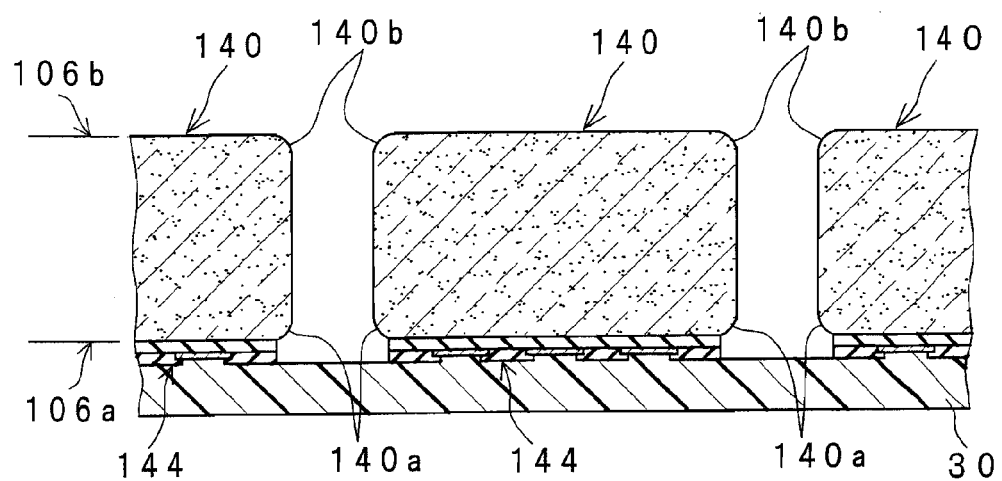

Next, removal of the polyimide film 146 exposed at the dividing regions R2, i.e., the insulator removal process is started (step S21 of FIG. 11). However, due to the polyimide film 146 used as the insulating film for the semiconductor wafer 106 of the present second embodiment, an etching gas capable of positively effecting plasma etching on the polyimide film 146 is used. For example, a gas that contains oxygen is used as the etching gas. In the plasma processing apparatus 101, the gases of the kinds used in each processing are stored in the gas supply units 20A, 20B and 20C. By thus carrying out the insulator removal process, as shown in FIG. 20B, the exposed polyimide film 146 is removed from the portions that correspond to the dividing regions R2. Consequently, the semiconductor wafer 106 is divided into individual pieces of device-formation-regions R1, so that the individual pieces of the semiconductor chips 140 are to be formed.

Figure 21A:
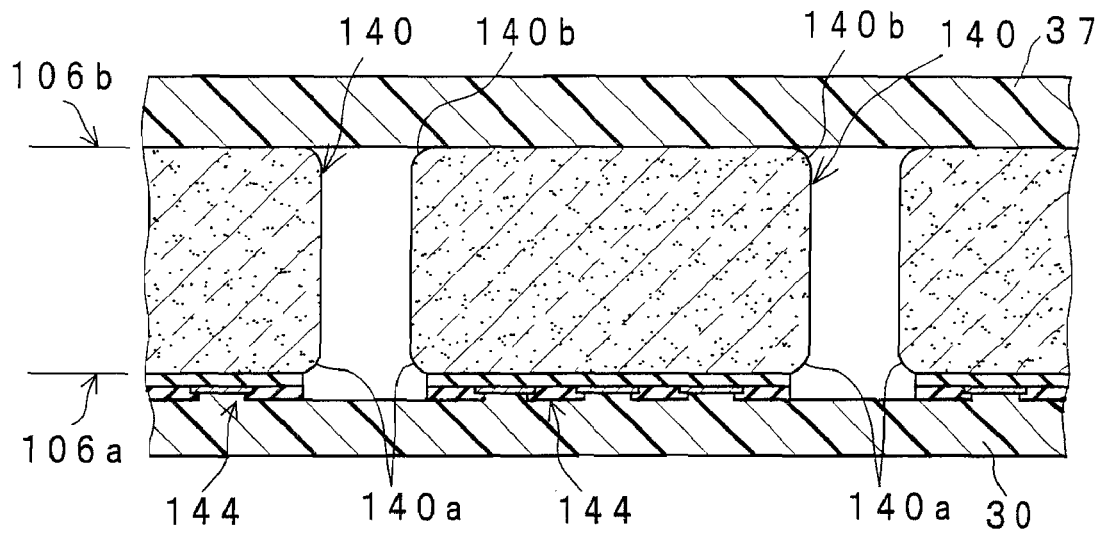
FIGS. 21A and 21B are schematic explanatory views of the semiconductor wafer showing the processes of the semiconductor chip manufacturing method continued from FIG. 20B, where.
Figure 21B:
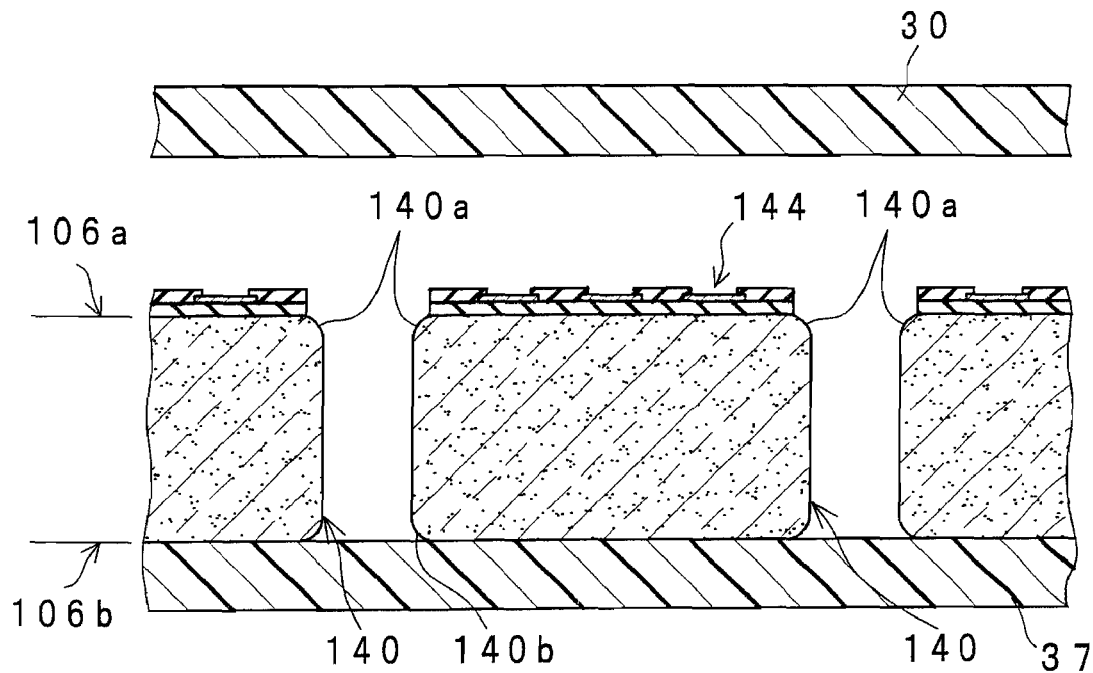

Subsequently, as shown in FIGS. 21A and 21B, a die-bonding sheet 37 is stuck to the processing-target-face 106b, and the protective sheet 30 is peeled off from the circuit-formation-face 106a. As a result, the manufacturing processes of the semiconductor chips 140 are completed.

As described above, even when the semiconductor wafer 106 uses the polyimide film 146 that is the surface protection film as the insulating film placed in the dividing regions R2, the rounded portions 140b can be formed at the end portions on the processing-target-face 106b during the plasma dicing process as in the first embodiment, and the rounded portions 140a can be formed at the end portions on the circuit-formation-face 106a side by carrying out notch formation. Therefore, semiconductor chips 140 that have corner portions formed of smooth curved convex surface portions with all the ridgelines removed can be formed, and semiconductor chips of which the transverse rupture strength can be improved can be manufactured.

Modification Example of Second Embodiment

Although the case where the polyimide film 146 formed as the surface protection film is used as the insulating film placed in the dividing regions R2 has been described above, the present second embodiment is not limited only to the case. It may be a case where, for example, a silicon nitride film formed of silicon nitride ($Si_3N_4$) is used as the surface protection film in place of such a case. The case where the silicon nitride film is used is described below as a semiconductor chip manufacturing method according to a modification example of the present second embodiment. Moreover, for the description, a flow chart showing the procedure of the semiconductor chip manufacturing method is shown in FIG. 22, and a schematic explanatory view showing a state in which a notch formation process and a silicon-nitride film (insulator) removal process are concurrently carried out is shown in FIG. 23.

Figure 22:
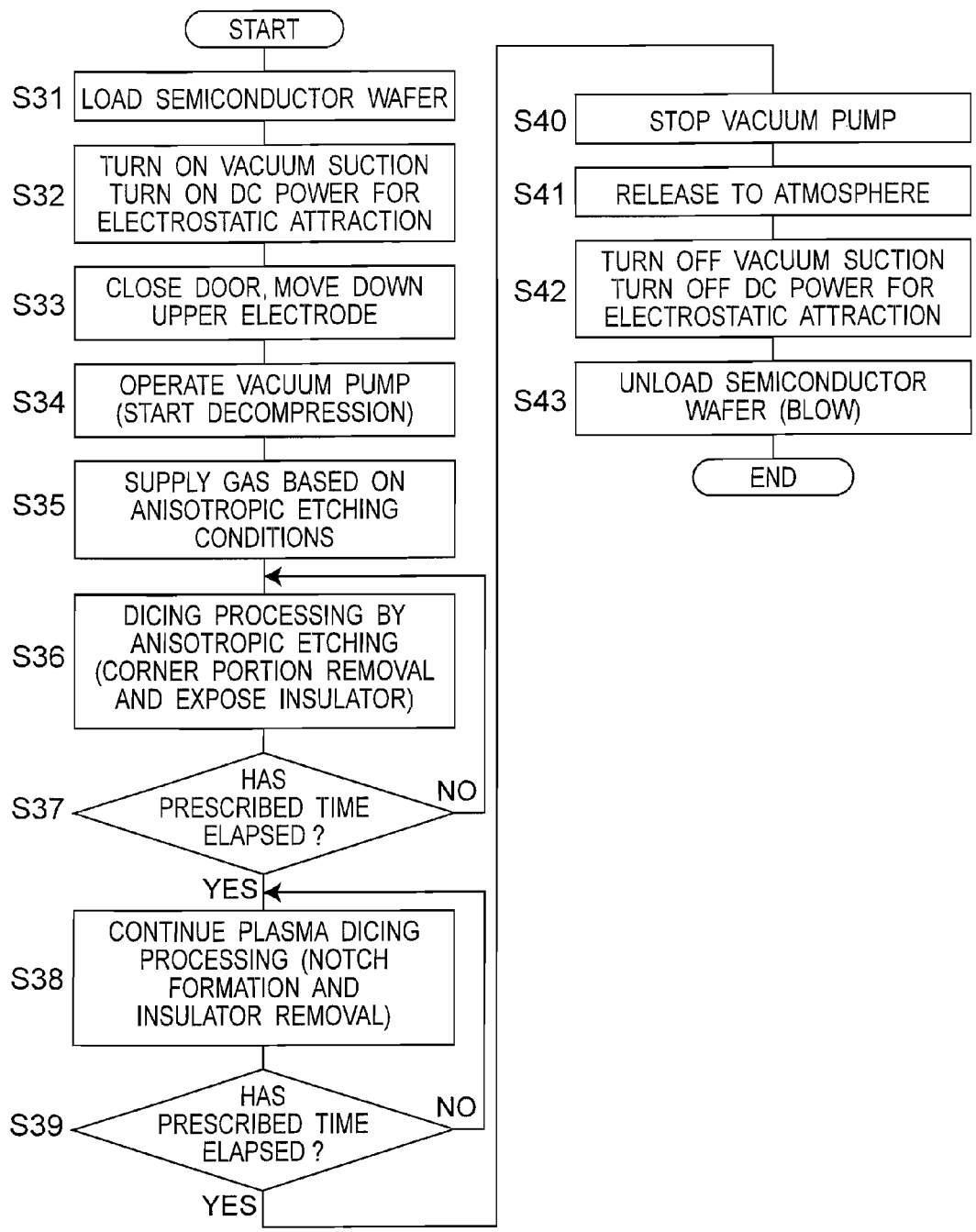
FIG. 22 is a flow chart showing the procedure of a semiconductor wafer dividing method according to a modification example of the second embodiment.
Figure 23:
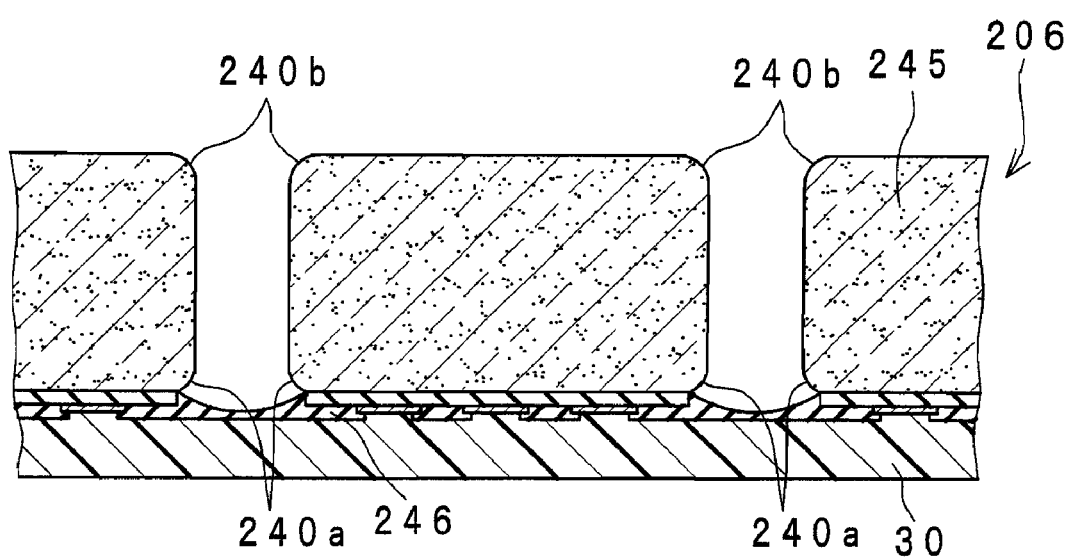
FIG. 23 is a schematic sectional view of a semiconductor wafer showing the semiconductor chip manufacturing method of the modification example of the second embodiment.

First of all, as shown in the flow chart of FIG. 22, the loading of a semiconductor wafer 206 where dividing-groove portions are formed in step S31 to the completion of the second corner portion removal process and the insulator exposure process in step S37 are similar to the procedure of the first embodiment of FIG. 11. Subsequently, the exposed silicon-nitride film 246 is to be removed by anisotropic etching in step S38. With regard to the gas for etching the silicon nitride film 246, the same gas as the sulfur hexafluoride gas ($SF_6$) that is the gas for etching the silicon substrate 145 is used. Therefore, in the schematic explanatory view of FIG. 23 showing a plasma dicing process state of the semiconductor wafer 206 where the silicon nitride film 246 is formed as the insulating film, when the silicon nitride film 246 is exposed from the bottom portions of the formed groove portions 206c by etching the silicon substrate 245 in the portions that correspond to the dividing regions R2 by using $SF_6$, notch formation is carried out by bending the trajectory of the incident ions by charging the exposed silicon nitride film 246 with positive charge, and the exposed silicon nitride film 246 is concurrently etched. Consequently, by carrying out the plasma dicing process by the anisotropic etching for notch formation, the exposed silicon nitride film 246 can be removed (notch formation and insulator removal process).

As described above, in order to concurrently carry out the formation of rounded portions 240*a* on the semiconductor chips 240 by notch formation and the removal of the exposed silicon nitride film 246, it is preferable to determine the formation thickness of the silicon nitride film 246 in consideration of the plasma processing time necessary for forming the desired notches.

In the flow chart of FIG. 22, the plasma dicing process is completed through the prescribed procedure in steps S40 through S43, and semiconductor chips 240 are formed.

Third Embodiment

Figure 24:
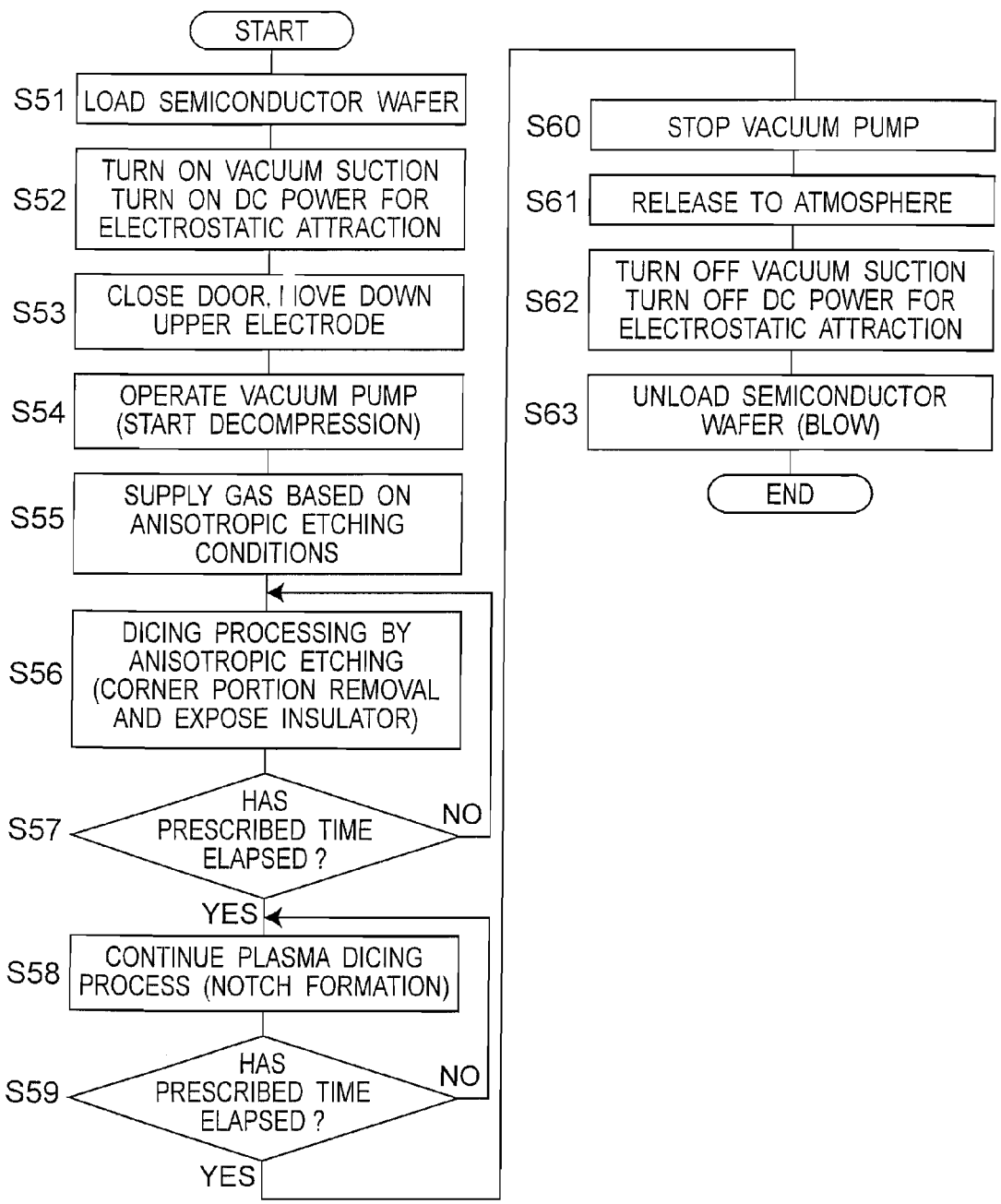
FIG. 24 is a flow chart showing the procedure of a semiconductor wafer dividing method according to a third embodiment of the present invention.

Next, a manufacturing method for semiconductor chips according to the third embodiment of the present invention is described below with reference to the flow chart of the procedure shown in FIG. 24 and the schematic explanatory views shown in FIG. 25, FIGS. 26A through 26C and FIGS. 27A and 27B. By the manufacturing method for semiconductor chips of the present third embodiment, notch formation and so on are carried out by using a protective sheet that has an insulating property as the insulating film to be placed in the dividing regions R2 unlike the first embodiment and the second embodiment. Only the different point is described below. Moreover, the manufacturing method for semiconductor chips of the third embodiment can be carried out by the processing apparatus 101 used in the first embodiment. Therefore, no description is provided for the construction and so on of the plasma processing apparatus 101.

Figure 25:
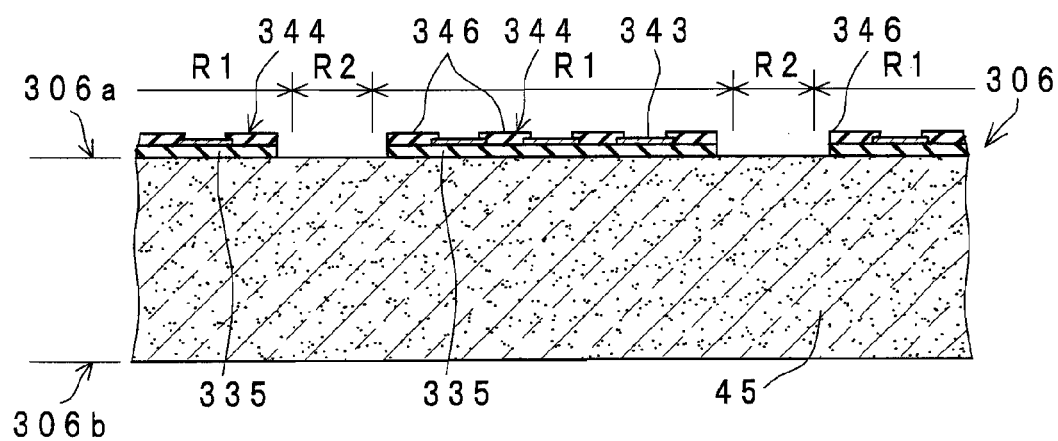
FIG. 25 is a partially enlarged schematic sectional view of the semiconductor wafer of the third embodiment.

As shown in FIG. 25, a semiconductor device 344 is formed in each of the device-formation-regions R1 on a circuit-formation-face 306*a* of a semiconductor wafer 306. The semiconductor device 344 include devices such as a MOS structure transistor constructed of a silicon substrate 45, a silicon oxide 335 formed directly on the circuit-formation-face 306*a*, and a metal film formed on the silicon oxide 335. Further, the semiconductor device 344 also has connection terminals 343 for electrically connecting the devices to external electronic apparatuses. Moreover, the surface of the semiconductor device 344 is covered with a surface protection film 346. The connection terminals 343 are not covered with the surface protection film 335 but exposed outside. Moreover, neither the silicon oxide 335 nor the surface protection film 346 is formed in the portions that correspond to dividing regions R2.

First, a protective sheet is adhesively stuck to the circuit-formation-face 306*a* of the semiconductor wafer 306 for the protection of the surface. In the present third embodiment, an insulating protective sheet 330 that has an electrical insulation property is used as the protective sheet. Moreover, the insulating protective sheet 330 described above serves as one example of the insulating film to be placed in the dividing regions R2.

Subsequently, the semiconductor wafer 306 is reduced in thickness by carrying out an abrading process, and subsequently further carrying out a groove formation process, dividing-groove portions 306*c* are formed so as to coincide with the dividing regions R2 on a processing-target-face 306*b*. The semiconductor wafer 306 where the dividing-groove portions 306*c* are thus formed is the semiconductor wafer in the state shown in FIG. 26A.

Figure 26A:
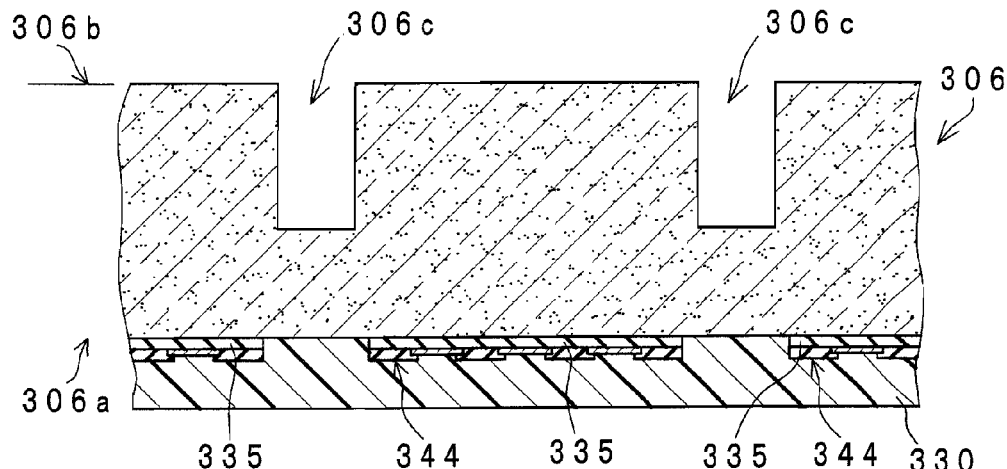
FIGS. 26A through 26C are schematic explanatory views of a semiconductor wafer showing the processes of the semiconductor chip manufacturing method of the third embodiment, where.
Figure 26B:
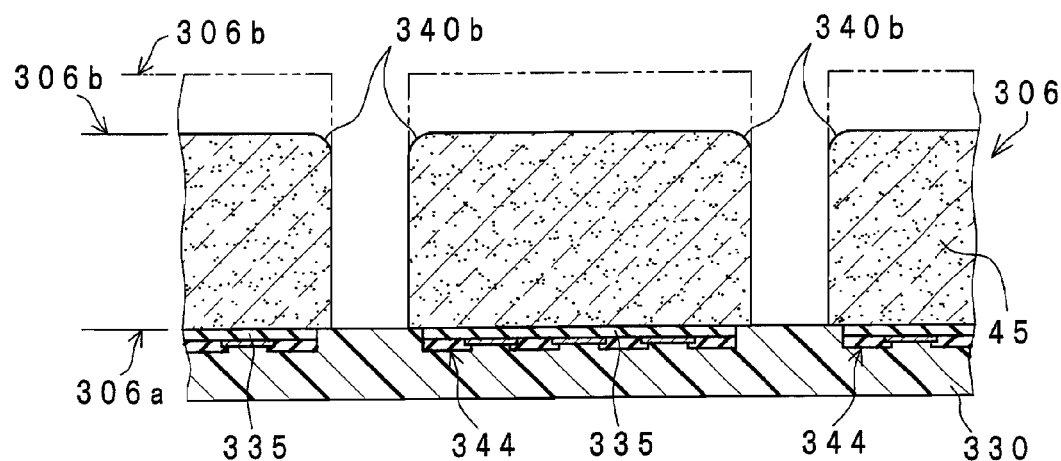

Next, the semiconductor wafer 306 where the dividing-groove portions 306*c* are thus formed is subjected to plasma processing by means of the plasma processing apparatus 101. In concrete, a prescribed procedure is carried out in steps S51 through S55 shown in FIG. 24, and thereafter, as shown in FIG. 26B, removal of the portions that correspond to the dividing regions R2, i.e., removal of the dividing-groove portions 306*c* is carried out by carrying out a plasma dicing process by anisotropic etching, and corner portions at the entrance end portions of the dividing-groove portions 306*c* are removed, forming rounded portions 340*b* (second corner portion removal process and protective sheet exposure process in steps S56 and S57 of FIG. 24). As a result, the semiconductor wafer 306 is divided into individual pieces of the device-formation-regions R1, so that the individual pieces of the semiconductor chips 340 are formed.

Figure 26C:
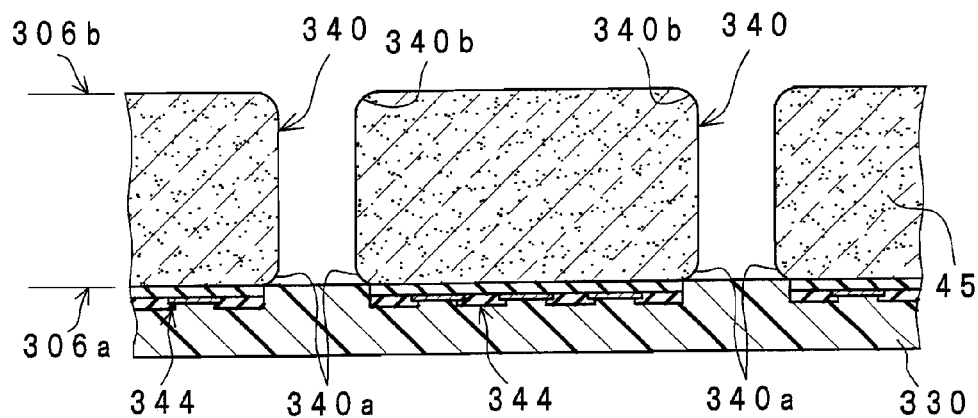

Moreover, if the portions that correspond to the dividing regions R2 are removed as described above, the surface of the insulating protective sheet 330 is to be exposed (i.e., the insulating film is exposed) in the dividing regions R2. When the insulating protective sheet 330 is exposed as described above, the exposed insulating protective sheet 330 is charged with the positive charge of the ions in the plasma, the trajectory of the subsequently incident ions is bent, and the notches 342 are formed at the corner portions located on the illustrated lower side of the semiconductor chips 340, i.e., the rounded portions 340*a* are formed as shown in FIG. 26C. When the rounded portions 340*a* of the desired size are formed (notch formation process or first corner portion removal process in steps S58 and 59 of FIG. 24), the plasma dicing process by the anisotropic etching is ended.

Subsequently, the prescribed procedure in steps S60 through S63 are carried out, and the separating process of the semiconductor chips 340 by plasma dicing is completed.

Figure 27A:
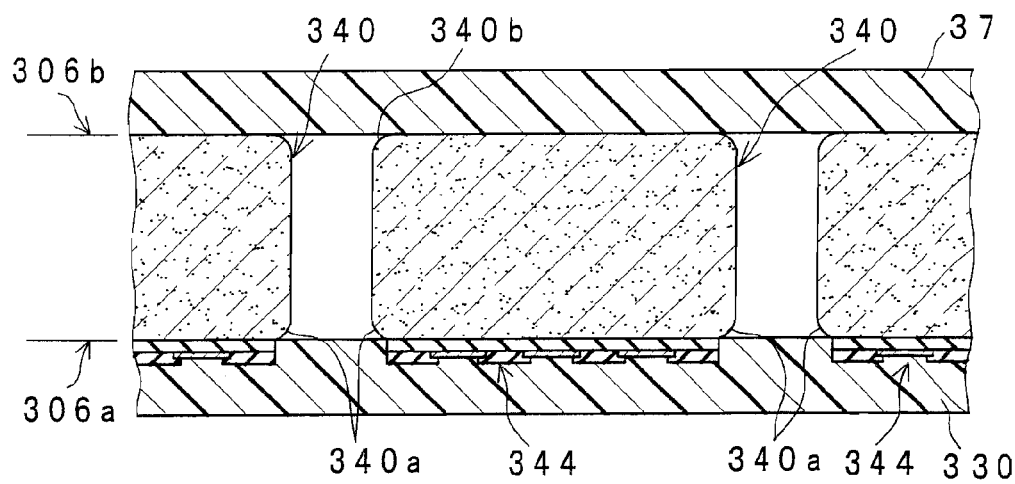
FIGS. 27A and 27B are schematic explanatory views of the semiconductor wafer showing the processes of the semiconductor chip manufacturing method continued from FIG. 26C, where.
Figure 27B:
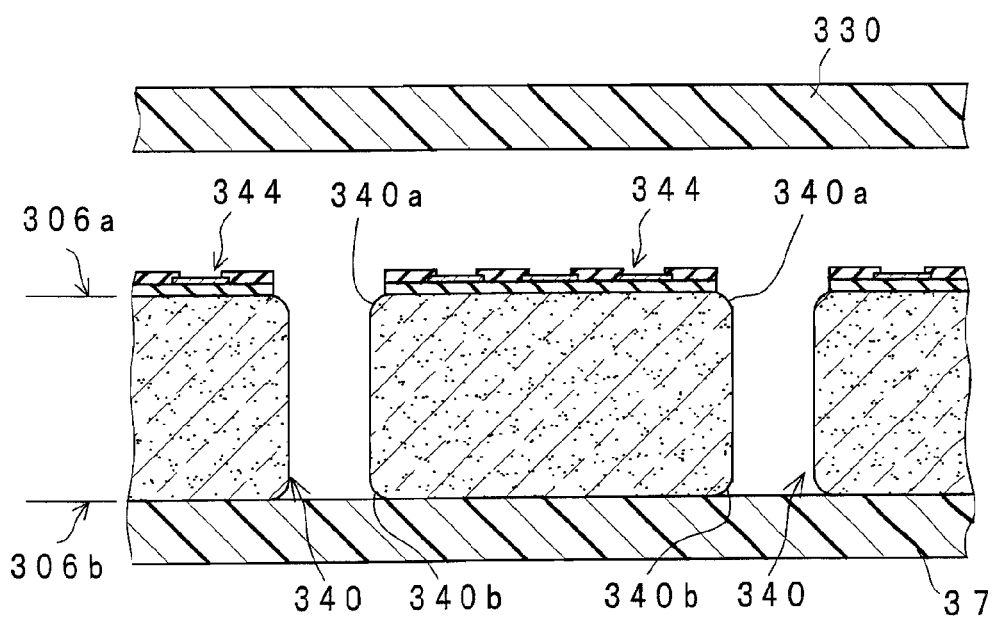
Figure 28A:
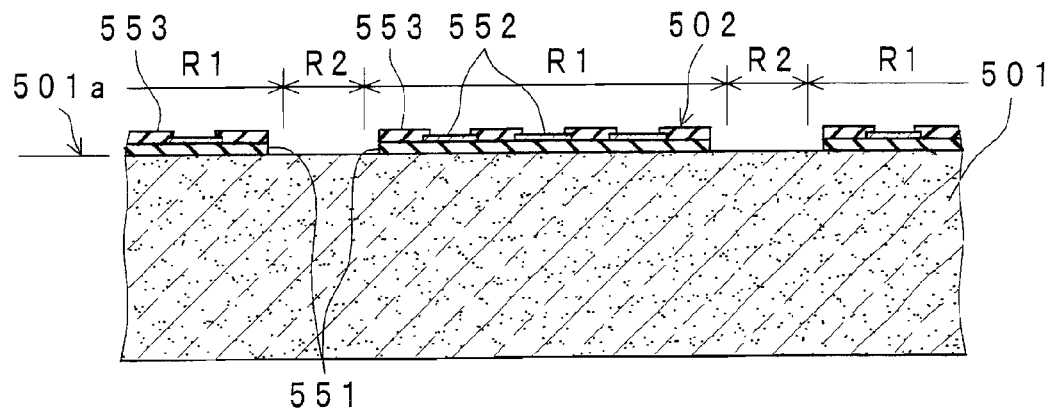
FIGS. 28A through 28C are schematic explanatory views of a semiconductor wafer showing a conventional semiconductor chip manufacturing method, where.
Figure 28B:
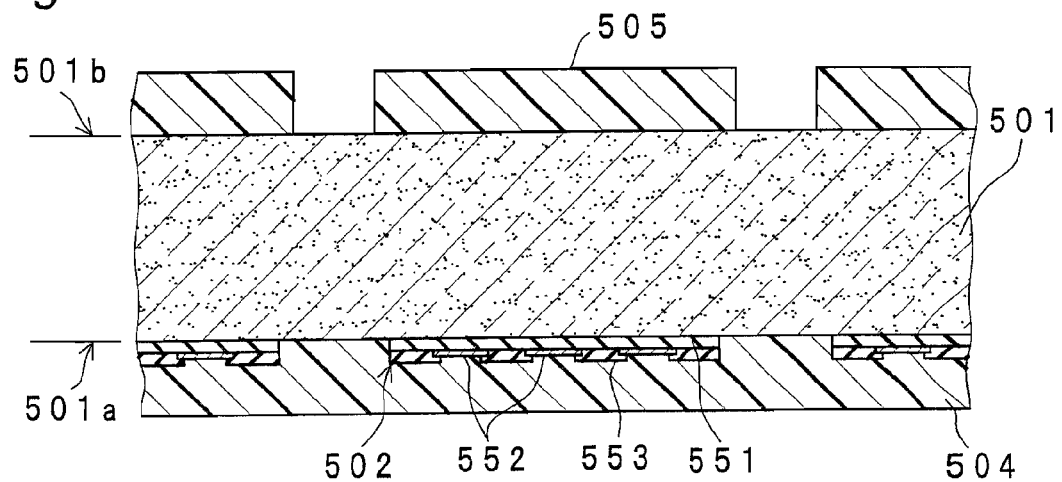
Figure 28C:
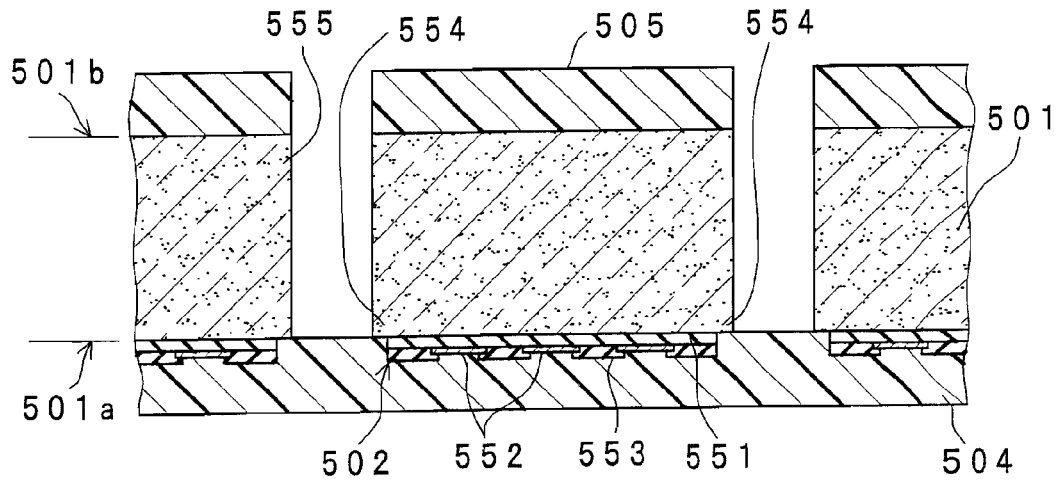
Figure 29A:
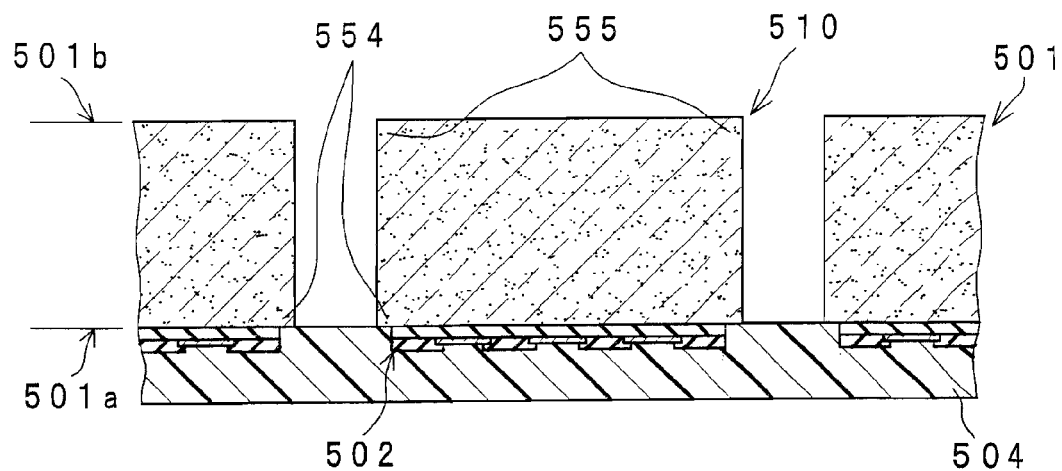
FIGS. 29A and 29B are schematic explanatory views of the semiconductor wafer showing the conventional semiconductor chip manufacturing method continued from FIG. 28, where.
Figure 29B:
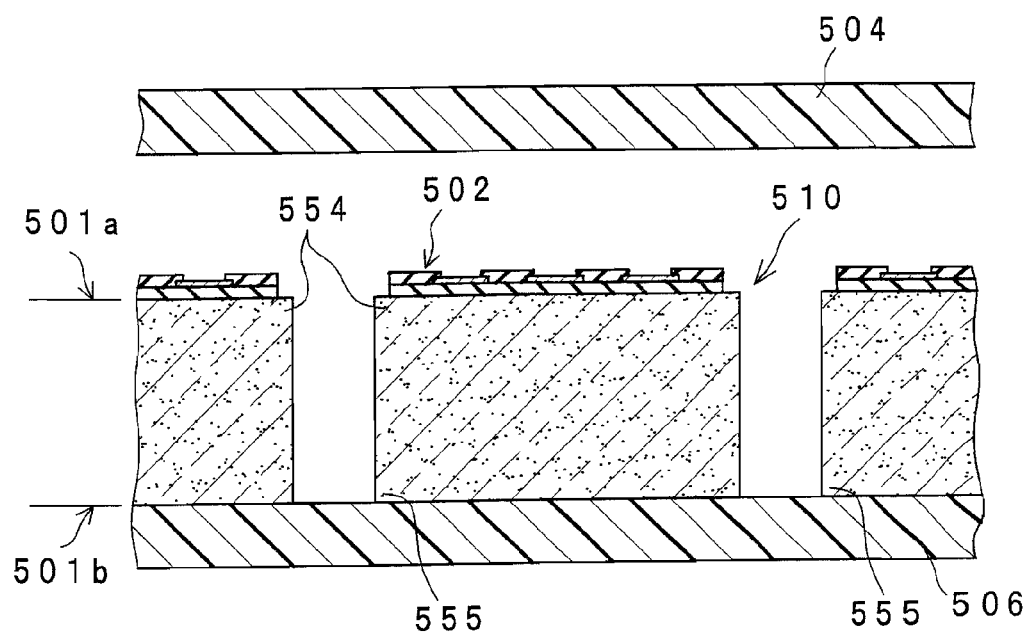
Figure 30:
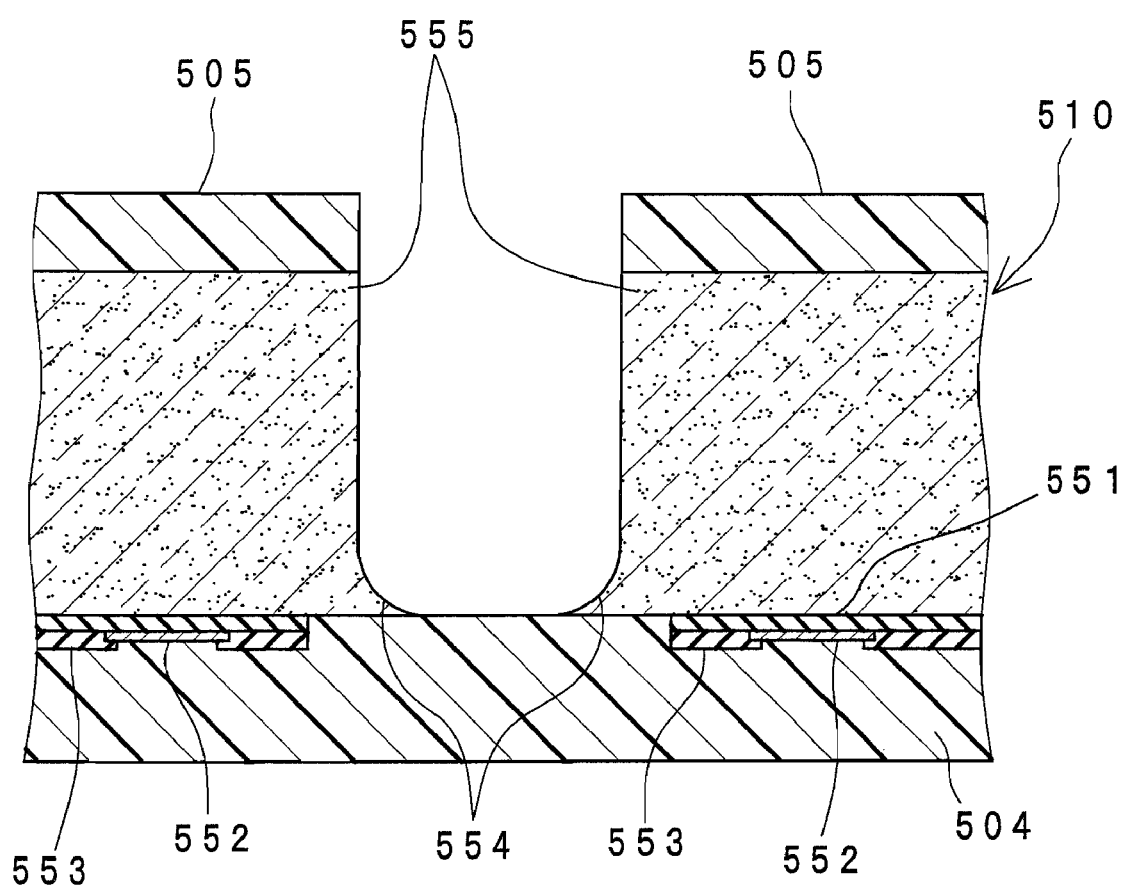
FIG. 30 is a partially enlarged schematic view in the neighborhood of the dividing regions of a semiconductor wafer in a state in which the plasma dicing process of the conventional semiconductor wafer is carried out.

Further, as shown in FIGS. 27A and 27B, the die-bonding sheet 37 is stuck to the processing-target-face 306*b* of the semiconductor wafer 306, and the insulating protective sheet 330 is peeled off from the circuit-formation-face 306*a*. As a result, semiconductor chips 340, where rounded portions 340*a* are formed at the corner portions of the circuit-formation-face 306*a* and the rounded portions 340*b* are formed at the corner portions of the processing-target-face 306*b*, are manufactured.

Since the notch formation is performed as described above, the rounded portions 340*a* can be formed on the manufactured semiconductor chips 340 even when the insulating protective sheet 330 is used as the insulating film to be placed in the dividing regions R2, and the semiconductor chips of which the transverse rupture strength is improved can be manufactured.

Moreover, a manufacturing method for semiconductor chips, which can obviate the need for carrying out the plasma etching process for removing the insulating film by using the insulating protective sheet 330 that can freely be adhesively stuck to or peeled off from the semiconductor wafer 306 as the insulating film and of which the efficiency is improved, can be provided.

The semiconductor chips manufactured by the semiconductor chip manufacturing method of the present invention can improve the transverse rupture strength by virtue of the curved convex surface portions formed in the portions that correspond to the positions where the ridgelines are formed so that all the ridgelines are removed. Therefore, it is particularly effective to use the semiconductor chips for IC cards with built-in semiconductor chips such as personal authentication cards. The above is because such IC cards have the features that they are often portably used and often contain important information separated inside, and the reliability can be improved by using the semiconductor chips of the present invention of which the strength against bending is improved.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-120815 filed on Apr. 19, 2005 including specification, drawing and claims are incorporated herein by reference in its entirety.

The inventon claimed is:

1. A manufacturing method for semiconductor chips, the method comprising:
   providing a semiconductor wafer having a first side, a second side, a plurality of semiconductor devices placed in device-formation-regions of the first side, and an insulating film provided on the first side, wherein the first side of the semiconductor wafer is opposite relative to the second side of the semiconductor wafer;
   forming dividing-groove portions in the second side of the semiconductor wafer, the dividing-groove portions being located in dividing regions of the second side of the semiconductor wafer;
   performing plasma etching on the semiconductor wafer from the second side to etch an entire surface of the second side including all surfaces of the dividing-groove portions, whereby corner portions formed on the second side at the dividing-groove portions are rounded, and portions of the insulating film are exposed by removing remaining portions of the wafer at the dividing-groove portions;
   rounding corner portions formed on the first side at the dividing-groove portions and being in contact with the insulating film, the corner portions being removed by continuously performing the plasma etching in a state in which exposed surfaces of the insulating film are charged with electric charge due to ions in plasma; and
   subsequently, removing exposed insulating film from the first side so that the device-formation-regions are individually separated, and thereby semiconductor chips each of which includes one of the semiconductor devices are manufactured.

2. The manufacturing method for the semiconductor chips as defined in claim 1, wherein, in forming the dividing-groove portions, the dividing-groove portions are formed so that their depth dimension becomes equal to or greater than a thickness dimension of the semiconductor devices that are finally separated into individual pieces.

3. The manufacturing method for the semiconductor chips as defined in claim 1, wherein
   a damaged layer generated in a neighborhood of the dividing-groove portions due to the formation of the dividing-groove portions is removed by performing the plasma etching.

4. The manufacturing method for the semiconductor chips as defined in claim 1, wherein
   the semiconductor wafer is reduced in thickness by carrying out an abrading process on the second side of the semiconductor wafer before the formation of the dividing-groove portions, and
   a damaged layer generated in a neighborhood of the second side due to the abrading process is removed by the plasma etching after the formation of the dividing-groove portions.

5. The manufacturing method for the semiconductor chips as defined in claim 1, wherein, in forming the dividing-groove portions, the dividing-groove portions are formed by processing the second side of the semiconductor wafer by means of a dicer.

6. The manufacturing method for the semiconductor chips as defined in claim 1, wherein, in the plasma etching from the second side, the insulating film formed of silicon oxide (SiO2) on the first side of the semiconductor wafer is exposed from the etching bottom portion.

7. The manufacturing method for the semiconductor chips as defined in claim 1, wherein, in the plasma etching from the second side, a surface protection film formed of polyimide (PI) to protect surfaces of the semiconductor devices formed on the first side of the semiconductor, wafer is exposed from an etching bottom portion as the insulating film.

8. A manufacturing method for semiconductor chips comprising:
   providing a semiconductor wafer having a first side, a second side, a plurality of semiconductor devices placed in device-formation-regions of the first side, and an insulating film provided on the first side, wherein the first side of the semiconductor wafer is opposite relative to the second side of the semiconductor wafer;
   forming dividing-groove portions in the second side of the semiconductor wafer, the dividing-groove portions being located in dividing regions of the second side of the semiconductor wafer;
   performing plasma etching on the semiconductor wafer from the second side to etch an entire surface of the second side including surfaces of the dividing-groove portions, whereby corner portions formed on the second side at the dividing-groove portions are rounded, and portions of the insulating film are exposed by removing remaining portions of the wafer at the dividing-groove portions; and
   removing the exposed insulating film while rounding corner portions formed on the first side in contact with the insulating film in the device-formation-regions by continuously performing the plasma etching in a state in which exposed surfaces of the insulating film is charged with electric charge due to ions in plasma, whereby the device-formation-regions are individually separated to form semiconductor chips each of which includes at least one of the semiconductor devices.

9. The manufacturing method for the semiconductor chips as defined in claim 8, wherein, in forming the dividing-groove portions, the dividing-groove portions are formed so that their depth dimension becomes equal to or greater than a thickness dimension of the semiconductor devices that are finally separated into individual pieces.

10. The manufacturing method for the semiconductor chips as defined in claim 8, wherein
    a damaged layer generated in the neighborhood of the dividing-groove portions due to the formation of the dividing-groove portions is removed by performing the plasma etching.

11. The manufacturing method for the semiconductor chips as defined in claim 8, wherein the semiconductor wafer is reduced in thickness by carrying out an abrading process on the second side of the semiconductor wafer before the formation of the dividing-groove portions, and a damaged layer generated in the neighborhood of the second surface due to the abrading process is removed by the plasma etching after the formation of the dividing-groove portions.

12. The manufacturing method for the semiconductor chips as defined in claim 8, wherein, in forming the dividing-groove portions, the dividing-groove portions are formed by processing the second side of the semiconductor wafer by means of a dicer.

13. The manufacturing method for the semiconductor chips as defined in claim 8, wherein, in the plasma etching from the second side, a surface protection film that is formed of silicon nitride (Si3N4) to protect the surfaces of the semiconductor devices formed on the first side of the semiconductor wafer is exposed from an etching bottom portion of the insulating film.

14. A manufacturing method for semiconductor chips comprising:
providing a semiconductor wafer having a first side, a second side, and a plurality of semiconductor devices placed in device-formation-regions of the first side, wherein the first side of the semiconductor wafer is opposite relative to the second side of the semiconductor wafer; forming dividing-groove portions in the second side of the semiconductor wafer, the dividing-groove portions being located in dividing regions of the second side of the semiconductor wafer;
performing plasma etching on the semiconductor wafer from the second side to etch an entire surface of the second side including surfaces of the dividing-groove portions, whereby corner portions formed on the second side at the dividing-groove portions are rounded, and portions of a protective sheet, which is stuck to the first side of the wafer, are exposed by removing remaining portions of the wafer at the dividing-groove portions, whereby corner portions located on the second side are removed in the device-formation-regions, and the protective sheet is exposed by removing a remainder of the semiconductor wafer at the dividing-groove portions in the dividing regions, and then the device-formation-regions are separated into individual semiconductor chips; and
rounding corner portions formed on the first side at the dividing-groove portions and being in contact with the protective sheet by continuously performing the plasma etching in a state in which exposed surfaces of the protective sheet is charged with electric charge due to ions in plasma, whereby semiconductor chips, each of which includes at least one of the individualized semiconductor devices, are manufactured.

15. The manufacturing method for the semiconductor chips as defined in claim 14, wherein, in forming the dividing-groove portions, the dividing-groove portions are formed so that their depth dimension becomes equal to or greater than a thickness dimension of the semiconductor devices that are finally separated into individual pieces.

16. The manufacturing method for the semiconductor chips as defined in claim 14, wherein
a damaged layer generated in a neighborhood of the dividing-groove portions due to the formation of the dividing-groove portions is removed by performing the plasma etching.

17. The manufacturing method for the semiconductor chips as defined in claim 14, wherein
the semiconductor wafer is reduced in thickness by carrying out an abrading process on the second side of the semiconductor wafer before the formation of the dividing-groove portions, and
a damaged layer generated in a neighborhood of the second side due to the abrading process is removed by the plasma etching after the formation of the dividing-groove portions.

18. The manufacturing method for the semiconductor chips as defined in claim 14, wherein, in forming the dividing-groove portions, the dividing-groove portions are formed by processing the second side of the semiconductor wafer by means of a dicer.

19. The manufacturing method for the semiconductor chips as defined in claim 14, wherein, the corner portions on the second side are removed, and thereafter, the protective sheet is peeled off and removed from the first side of the semiconductor wafer.

* * * * *